United States Patent [19]

Mitsui et al.

[11] Patent Number: 5,602,414
[45] Date of Patent: Feb. 11, 1997

[54] INFRARED DETECTOR HAVING ACTIVE REGIONS AND ISOLATING REGIONS FORMED OF CDHGTE

[75] Inventors: Kotaro Mitsui; Zenpei Kawazu; Kazuo Mizuguchi; Seiji Ochi; Yuji Ohkura; Norio Hayafuji; Hirotaka Kizuki; Mari Tsugami; Akihiro Takami; Manabu Katoh, all of Itami, Japan

[73] Assignee: Mitsubishi Denki Kabushiki Kaisha, Tokyo, Japan

[21] Appl. No.: 260,791

[22] Filed: Jun. 16, 1994

[30] Foreign Application Priority Data

Jun. 18, 1993 [JP] Japan .................................. 5-147162

[51] Int. Cl.⁶ .................................................. H01L 31/00
[52] U.S. Cl. ........................ 257/442; 257/443; 257/452; 257/459
[58] Field of Search .................................. 257/442, 443, 257/452, 457, 459

[56] References Cited

U.S. PATENT DOCUMENTS

| 4,646,120 | 2/1987 | Halskaylo | 257/442 |
|---|---|---|---|
| 5,115,295 | 5/1992 | Hisa | 257/443 |

FOREIGN PATENT DOCUMENTS

| 63-43366 | 2/1988 | Japan . |
|---|---|---|
| 63-222466 | 9/1988 | Japan . |
| 1205475 | 8/1989 | Japan . |
| 2235378 | 9/1990 | Japan . |
| 2272766 | 11/1990 | Japan . |
| 385762 | 4/1991 | Japan . |
| 3-175682 | 7/1991 | Japan . |
| 3183170 | 8/1991 | Japan . |
| 4-269869 | 9/1992 | Japan . |
| 2051477 | 4/1980 | United Kingdom . |
| 2095905 | 2/1982 | United Kingdom . |
| 2241605 | 9/1985 | United Kingdom . |
| 2239555 | 3/1989 | United Kingdom . |
| 2265253 | 3/1992 | United Kingdom . |

Primary Examiner—Mahshid D. Saadat
Assistant Examiner—Nathan K. Kelley
Attorney, Agent, or Firm—Leydig, Voit & Mayer

[57] ABSTRACT

In a method for fabricating an infrared detector, initially, a CdHgTe layer of a first conductivity type is produced on a front surface of a semiconductor substrate, a plurality of spaced apart CdHgTe regions of a second conductivity type, opposite the first conductivity type, are produced at the surface of the first conductivity type CdHgTe layer, and part of the surface of the first conductivity type CdHgTe layer between the second conductivity type CdHgTe regions is selectively irradiated with a charged particle beam to evaporate Hg atoms from that part, whereby a CdHgTe separation region of the first conductivity type and having a Cd composition larger than that of the first conductivity type CdHgTe layer is produced penetrating through the first conductivity type CdHgTe layer and surrounding each of the second conductivity type CdHgTe regions. Therefore, a highly-integrated high-resolution infrared detector with no crosstalk between pixels is achieved.

7 Claims, 22 Drawing Sheets

INFRARED DETECTOR HAVING ACTIVE REGIONS AND ISOLATING REGIONS FORMED OF CDHGTE

FIELD OF THE INVENTION

The present invention relates to an infrared detector including a plurality of pixels and, more particularly, to an infrared detector that reduces crosstalk and increases the integration density of pixels. The invention also relates to a method for fabricating the infrared detector.

BACKGROUND OF THE INVENTION

FIG. 25 is a sectional view illustrating a prior art infrared detector. In the figure, the infrared detector 551 includes a p type CdTe substrate 1 having opposite front and rear surfaces. A p type $Cd_{0.2}Hg_{0.8}Te$ layer 2 is disposed on the front surface of the p type CdTe substrate 1. N type CdHgTe regions 31 and 32 are disposed within the p type $Cd_{0.2}Hg_{0.8}Te$ layer 2, reaching the surface, and negative electrodes 61 and 62 are disposed in contact with the CdHgTe regions 31 and 32, respectively. A positive electrode 5 is disposed on the rear surface of the p type CdTe substrate 1. Reference numerals 41 and 42 designate pn junctions. Reference numerals 101 and 102 designate infrared light responsive parts serving as pixels. Reference numeral 70 designates infrared light having a wavelength of 10 μm. Reference numerals 71 and 72 designate electrons. Although only two pixels 101 and 102 are shown in the FIG. 25, the infrared detector 551 includes a lot of pixels.

A description is given of the operation. The infrared light 70 incident on the CdTe substrate 1 is transmitted through the CdTe substrate 1 and absorbed in the p type $Cd_{0.2}Hg_{0.8}Te$ layer 2, producing electron-hole pairs. When electrons 71 and 72, i.e., minority carriers, reach the pn junctions 41 and 42, electric power representative of the quantity of the infrared light is output through the negative electrodes 61 and 62. In this way, the incidence of infrared light on each light responsive part, i.e., each pixel, can be detected by output power from each going power output. Therefore, this infrared detector 551 including a lot of pixels outputs electric signals representing an infrared image.

In this prior art infrared detector, however, a electron 71 that is produced in response to infrared light incident on a part of the substrate 1 opposite the pixel 101 unfavorably diffuses toward the pixel 102 and reaches the pn junction 42 of the pixel 102. Likewise, an electron 72 produced opposite the pixel 102 reaches the pn junction 41 of the pixel 101. In this case, the incident position of the infrared light is misjudged, i.e., crosstalk occurs.

Generally, the diffusion length of electrons in the p type $Cd_{0.2}Hg_{0.8}Te$ layer is about 40 μm. If the space between adjacent pixels is less than this diffusion length, the above-described crosstalk occurs, reducing the resolution. Therefore, an infrared detector with high resolution and high integration density cannot be realized.

FIG. 26 illustrates a sectional view of a prior art infrared detector that prevents the above-described problems, disclosed in Japanese Published Patent Application No. Hei. 2-272766. In FIG. 26 an infrared detector 552 includes a p type $Cd_{0.3}Hg_{0.7}Te$ substrate 14 having opposite front and rear surfaces. P type $Cd_{0.2}Hg_{0.8}Te$ layers 21 and 22 are disposed within the p type $Cd_{0.3}Hg_{0.7}Te$ substrate 14, reaching the front surface. N type CdHgTe regions 31 and 32 are disposed within the p type $Cd_{0.2}Hg_{0.8}Te$ layers 21 and 22, respectively, and negative electrodes 61 and 62 are disposed on the front surface of the substrate 14, contacting the n type CdHgTe regions 31 and 32, respectively. Positive electrodes 51 are disposed on the front surface of the substrate 14, contacting the p type $Cd_{0.2}Hg_{0.8}Te$ layers 21 and 22, respectively. Reference numerals 42 and 43 designate pn junctions. Reference numerals 101 and 102 designate infrared light responsive parts, i.e., pixels, of the infrared detector. MIS-FET (Metal Insulator Silicon Field Effect Transistor) switching elements 111 and 112 are disposed in the vicinity of the respective pixels 101 and 102 at the front surface of the substrate 14. Each MIS-FET switching element includes source and drain diodes 81 and 82, source and drain electrodes 83 and 84, and a gate electrode 85. These MIS-FET switching elements 111 and 112 are connected to the positive electrodes 51 of the pixels 101 and 102, respectively, via wiring layers 86.

A description is given of the operation. Infrared light 70 having a wavelength of 10 μm is incident on the rear surface of the p type $Cd_{0.3}Hg_{0.7}Te$ substrate 14 and absorbed in the p type $Cd_{0.2}Hg_{0.8}Te$ layers 21 and 22, whereby electric power representative of the quantity of the infrared light is produced. The electric power is output from the detector 552 according to the switching operation of the MIS-FETs 111 and 112.

In this prior art infrared detector, since the respective pixels are separated from each other by the substrate 14, the unwanted diffusion of charge carriers between adjacent pixels is prevented.

In production of this prior art infrared detector, a plurality of recesses are formed at the front surface of the $Cd_{0.3}Hg_{0.7}Te$ substrate 1 and, thereafter, the light responsive $Cd_{0.2}Hg_{0.8}Te$ layers are deposited in these recesses. In order to adequately absorb the incident infrared light, the depth of the recess must be at least 10 μm. However, it is very difficult to produce such recesses in the $Cd_{0.3}Hg_{0.7}Te$ substrate at high density.

Further, since the MIS-FET switching elements are disposed between the respective pixels, the space between the adjacent pixels must be about 10 μm and, therefore, high-density integration is not realized.

SUMMARY OF THE INVENTION

An object of the present invention is to provide a highly-integrated infrared detector that reduces crosstalk.

Another object of the present invention is to provide a method for fabricating the infrared detector.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, in a method for fabricating an infrared detector including a plurality of light responsive CdHgTe regions, part of a first CdHgTe layer between light responsive regions is irradiated with a charged particle beam to produce a CdHgTe region having a Cd composition larger than that of the CdHgTe layer and surrounding each of the light responsive regions. In this method, since Hg atoms are evaporated from the part irradiated with charged particle beam, a narrow pixel separation CdHgTe region having a large Cd composition is produced with high precision.

According to a second aspect of the present invention, the light responsive regions are separated from each other by a groove penetrating through the CdHgTe layer. Since the groove prevents electrons generated in one pixel from diffusing into an adjacent pixel, crosstalk does not occur.

According to a third aspect of the present invention, the above-described groove is filled with a second CdHgTe layer having a Cd composition larger than that of the first CdHgTe layer. Therefore, a band gap barrier is produced between adjacent pixels, so that electrons generated in one pixel are reflected by this band gap barrier and do not diffuse into an adjacent pixel, preventing crosstalk.

According to a fourth aspect of the present invention, the above-described groove is filled with the second CdHgTe layer, and upper and lower CdHgTe layers having a Cd composition larger than that of the first CdHgTe layer are produced on the first CdHgTe layer and between the substrate and the first CdHgTe layer, respectively. Therefore, the first CdHgTe layer of each pixel is completely surrounded by the second CdHgTe layer and the upper and lower CdHgTe layers having a Cd composition larger than that of the first CdHgTe layer, so that the recombination loss at the surface of the first CdHgTe layer of each pixel is reduced.

According to a fifth aspect of the present invention, in a method for fabricating an infrared detector, a plurality of recesses are formed at a front surface of a semiconductor substrate, a first conductivity type CdHgTe separation layer is formed on the internal surface of each recess, a first conductivity type CdHgTe light responsive layer having a Cd composition smaller than that of the CdHgTe separation layer is deposited on the separation layer in each recess, a second conductivity type CdHgTe region is formed at the surface of the first conductivity type CdHgTe layer, and a CdHgTe window layer having a Cd composition larger than that of the first conductivity type CdHgTe layer is formed on the entire surface of the substrate. Therefore, the first conductivity type CdHgTe light responsive layer is easily surrounded by CdHgTe layers having a Cd composition larger than that of the light responsive layer.

According to a sixth aspect of the present invention, in a method for fabricating an infrared detector, a first conductivity type first CdHgTe separation layer having a plurality of recesses is formed on a semiconductor substrate, a first conductivity type CdHgTe layer having a Cd composition smaller than that of the first CdHgTe separation layer is grown on the separation layer until the grown layer has a flat surface, a groove reaching the first separation layer is formed penetrating through part of the first conductivity type CdHgTe layer between the recesses of the separation layer, a second CdHgTe separation layer having a Cd composition larger than that of the first conductivity type CdHgTe layer is formed in the groove, and a second conductivity type CdHgTe region is formed at the surface of the first conductivity type CdHgTe layer opposite each recess. Therefore, separation of pixels is easily carried out with high reliability.

According to a seventh aspect of the present invention, an infrared detector includes a semiconductor substrate having a light incident surface, a plurality of light responsive regions disposed on the semiconductor substrate opposite the light incident surface, and a plurality of convex lenses disposed on the light incident surface of the semiconductor substrate each lens being disposed opposite a respective light responsive region and collecting incident infrared light into a depletion layer of each light responsive region. Therefore, the rate of minority carriers generated in the vicinity of the pn junction of each light responsive region increases, so that crosstalk is suppressed even when the space between adjacent pixels is reduced.

According to an eighth aspect of the present invention, the infrared detector further includes a light shielding mask disposed on the light incident surface of the semiconductor substrate where the convex lenses are absent. Therefore, crosstalk due to infrared light incident on the substrate where the convex lenses are absent is prevented.

According to a ninth aspect of the present invention, an infrared detector includes a lattice-shaped electrode disposed on a surface of the semiconductor substrate opposite the light incident surface, surrounding each of the light responsive regions. In this structure, minority carriers recombine under the lattice-shaped electrode, whereby diffusion of carriers into adjacent pixels is prevented. In addition, the series resistance is reduced.

According to a tenth aspect of the present invention, the lattice-shaped electrode is disposed at the bottom of the groove for separating the light responsive regions from each other.

According to an eleventh aspect of the present invention, the lattice-shaped electrode fills the separation groove. Therefore, diffusion of carriers into adjacent pixels is prevented, and the internal resistance is reduced.

According to a twelfth aspect of the present invention, the lattice-shaped electrode is disposed in the separation groove via a CdHgTe layer having a Cd composition larger than that of the CdHgTe light responsive layer. Therefore, the recombination loss of electrons is reduced.

According to a thirteenth aspect of the present invention, in a method for fabricating an infrared detector, a plurality of buffer layers are formed on the substrate opposite the light responsive regions, a first conductivity type CdHgTe layer is epitaxially grown over the entire surface of the substrate, and a plurality of second conductivity type CdHgTe light responsive regions are produced at the surface of portions of the first conductivity type CdHgTe layer grown on the buffer layers. In this method, a region of high defect density is produced in the first conductivity type CdHgTe layer between adjacent pixels, whereby crosstalk is prevented.

According to a fourteenth aspect of the present invention, in a method for fabricating an infrared detector, a lattice-shaped base semiconductor layer having a lattice constant different from the lattice constant of the semiconductor substrate is formed on the semiconductor substrate, surrounding each of the light responsive regions. Thereafter, a first conductivity type CdHgTe layer is epitaxially grown over the entire surface of the substrate, and a plurality of second conductivity type CdHgTe regions are formed at the surface of portions of the first conductivity type CdHgTe layer grown directly on the semiconductor substrate. In this method, a region of high defect density is produced in the first conductivity type CdHgTe layer between adjacent pixels, whereby crosstalk is prevented.

According to a fifteenth aspect of the present invention, an infrared detector includes a high resistivity semiconductor layer separating a plurality of CdHgTe light responsive regions from each other. Therefore, electrons generated in one pixel are reflected by the high resistivity layer and never diffuse into an adjacent pixel.

According to a sixteenth aspect of the present invention, an infrared detector includes a semiconductor substrate having a plurality of recesses, a plurality of first conductivity type CdHgTe layers disposed in the recesses via an insulating film, and a plurality of second conductivity type CdHgTe light responsive regions disposed at the surface of the respective first conductivity type CdHgTe layers. Therefore, the respective pixels are electrically separated from each other, so that electrons generated in one pixel do not diffuse into an adjacent pixel.

DETAILED DESCRIPTION OF THE PREFERRED EMBODIMENTS.

Figure 2:
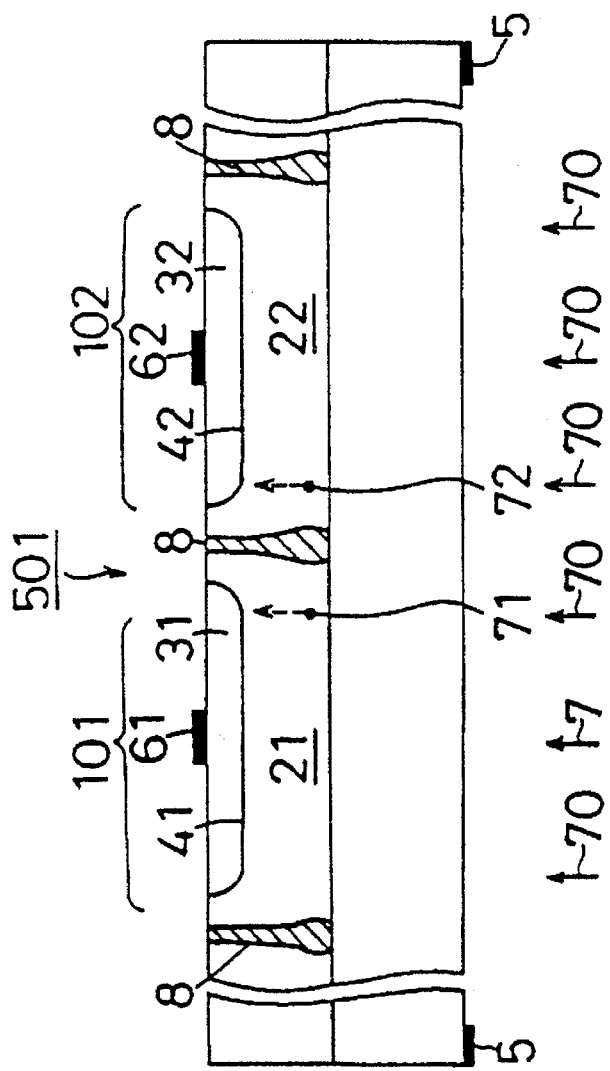
FIGS. 2(a) and 2(b) are a sectional view and an energy band diagram for explaining the operation of an infrared detector according to the first embodiment of the invention.
Figure 2:
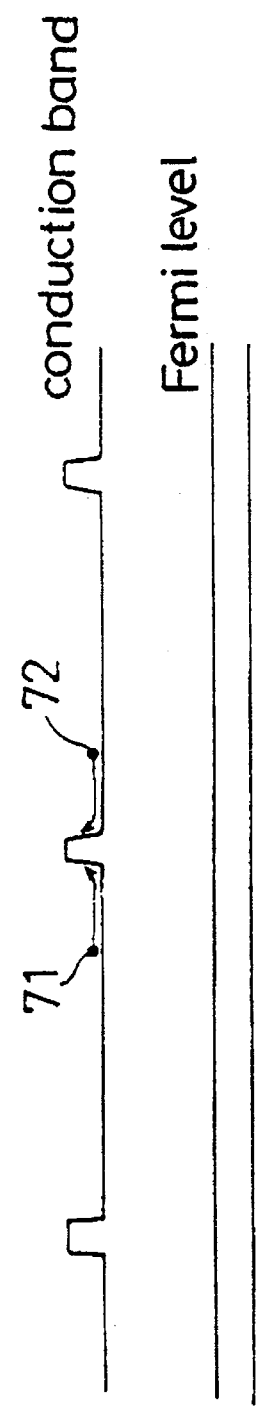

FIG. 2(a) is a sectional view illustrating an infrared detector in accordance with a first embodiment of the present invention. In the figure, the same reference numerals as those in FIG. 25 designate the same or corresponding parts. An infrared detector 501 according to the first embodiment of the invention is fundamentally identical to the prior art infrared detector 551 except that a $Cd_{0.3}Hg_{0.7}Te$ region 8 is disposed penetrating through the p type $Cd_{0.2}Hg_{0.7}Te$ layer 2 to isolate the pixels (infrared light responsive regions) from each other. The $Cd_{0.3}Hg_{0.7}Te$ region 8 is produced by electron beam irradiation.

FIGS. 1(a)–1(d) are sectional views illustrating process steps in a method for fabricating the infrared detector of FIG. 2(a).

Figure 1:
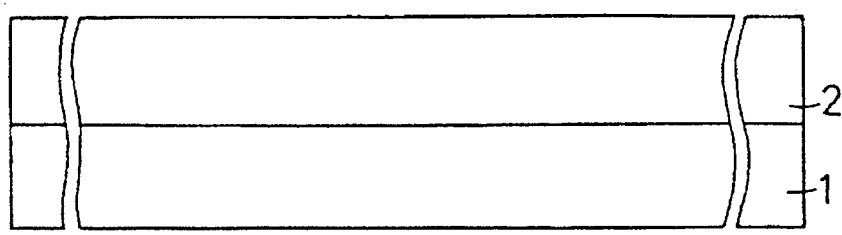
FIGS. 1(a)–1(d) are sectional views illustrating process steps in a method for fabricating an infrared detector in accordance with a first embodiment of the present invention.
Figure 1:
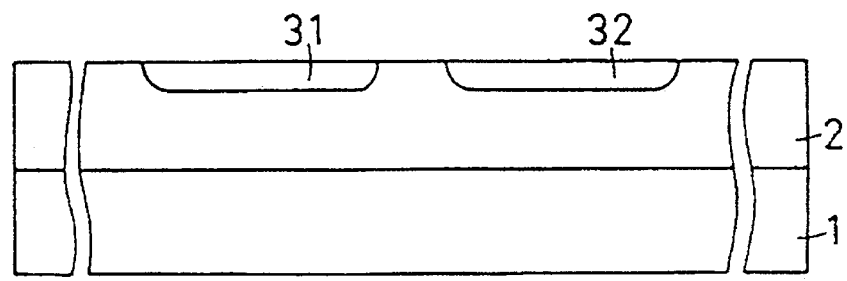
Figure 1:
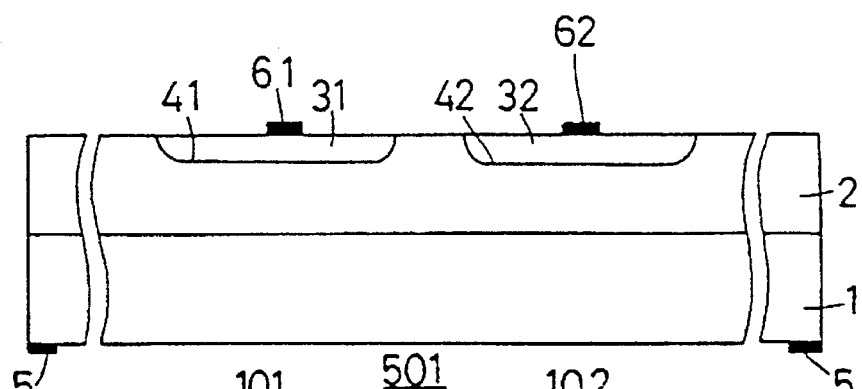
Figure 1:
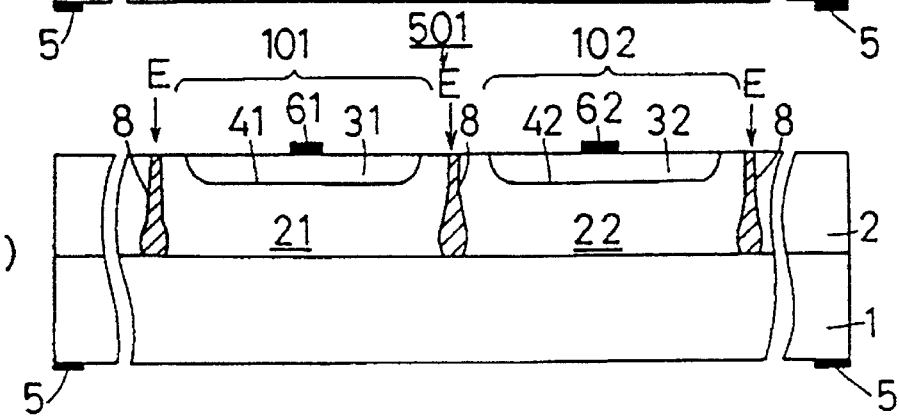

Initially, as illustrated in FIG. 1(a), a p type $Cd_{0.2}Hg_{0.8}Te$ layer 2 about 10 μm thick is grown on the p type CdTe substrate 1, preferably by LPE (Liquid Phase Epitaxy) or MOCVD (Metal Organic Chemical Vapor Deposition).

Thereafter, n type $Cd_{0.2}Hg_{0.8}Te$ regions 31 and 32 are selectively produced at the surface of the $Cd_{0.2}Hg_{0.8}Te$ layer 2, preferably by Hg diffusion or B (Boron) ion implantation (FIG. 1(b)).

In the step of FIG. 1(c), a positive electrode 5 is produced on the light incident surface of the p type CdTe substrate, and negative electrodes 61 and 62 are produced on the n type $Cd_{0.2}Hg_{0.8}Te$ regions 31 and 32, respectively. Preferably, these electrodes are formed by vacuum deposition of Cr, Au, or the like.

In the step of FIG. 1(d), portions of the $Cd_{0.2}Hg_{0.8}Te$ layer 2 to be pixel boundaries are irradiated with electron beam (E) having an energy of 300 KeV, at a dose rate of $3 \times 10^{11}$ e/cm$^2$/sec, for five minutes (total dose=$9 \times 10^{13}$ cm$^{-2}$), whereby a $Cd_{0.3}Hg_{0.7}Te$ separation region 8 penetrating through the $Cd_{0.2}Hg_{0.8}Te$ layer 2 and reaching the substrate 1 is produced. The mechanism of producing this separation region having a high Cd concentration using the electron beam irradiation is mentioned in "Surface Science" Vol.8, No.6 (published in 1987). In this publication, it is described that Hg atoms escape from the surface of the $Cd_{0.2}Hg_{0.8}Te_2$ layer 2 when irradiated with an electron beam, whereby the Cd composition increases. As a result, an about 3 μm wide separation region 8 completely surrounding each of the pixels 101 and 102 is produced.

As shown in FIG. 2(a), infrared light 70 having a wavelength of about 10 μm is incident on the CdTe substrate and absorbed in the p type $Cd_{0.2}Hg_{0.8}Te$ layers 21 and 22 corresponding to the pixels 101 and 102, producing electrons 71 and 72 (minority charge carriers), respectively. In this case, the electron 71 reaches the pn junction 41 of the pixel 101 and is detected as an output of the pixel 101. That is, since the p type $Cd_{0.2}Hg_{0.8}Te$ layer 21 is surrounded by the separation region 8 having a large Cd composition that provides an electric potential, the electron 71 does not diffuse into the adjacent pixel across this electric potential. Likewise, the electron 72 generated by infrared light incident on the pixel 102 is detected as an output of the pixel 102 (refer to FIG. 2(b)). Therefore, the crosstalk generated due to the diffusion of minority charge carriers in the prior art infrared detector is avoided, so that an infrared detector having improved pixel resolution is achieved without reducing the sensitivity. Further, since the separation region 8 is produced by electron beam patterning, a very narrow region of several microns is produced with high precision, whereby high-density integration of the pixels is realized.

FIGS. 3(a)–3(d) are sectional views illustrating process steps in a method for fabricating an infrared detector in accordance with a second embodiment of the present invention. In these figures, the same reference numerals as in FIGS. 1(a)–1(d) designate the same or corresponding parts. Reference numeral 8a designates a $Cd_{0.3}Hg_{0.7}Te$ separation region produced by irradiating part of the p type $Cd_{0.2}Hg_{0.8}Te$ layer 2 with a proton beam.

Figure 3:
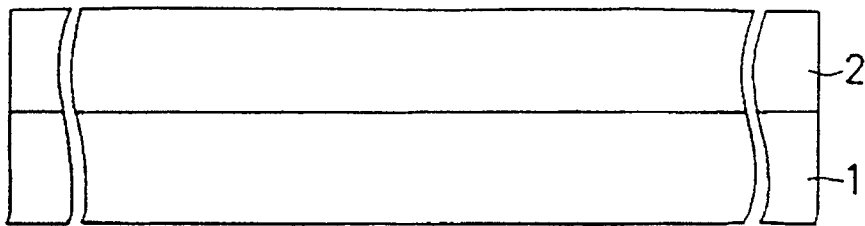
FIGS. 3(a)–3(d) are sectional views illustrating process steps in a method for fabricating an infrared detector in accordance with a second embodiment of the present invention.
Figure 3:
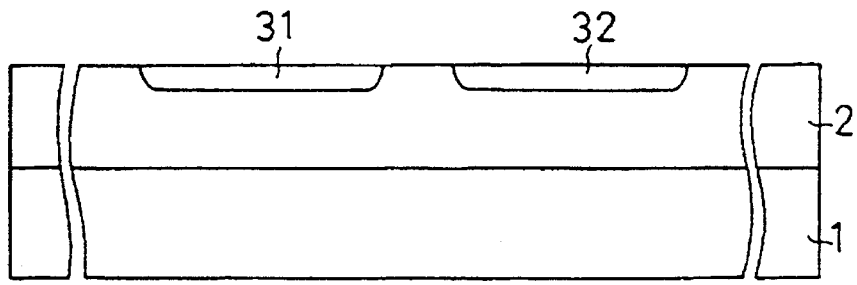
Figure 3:
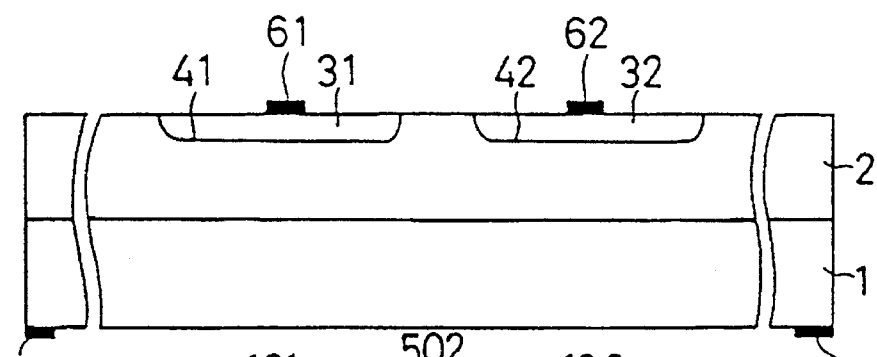
Figure 3:
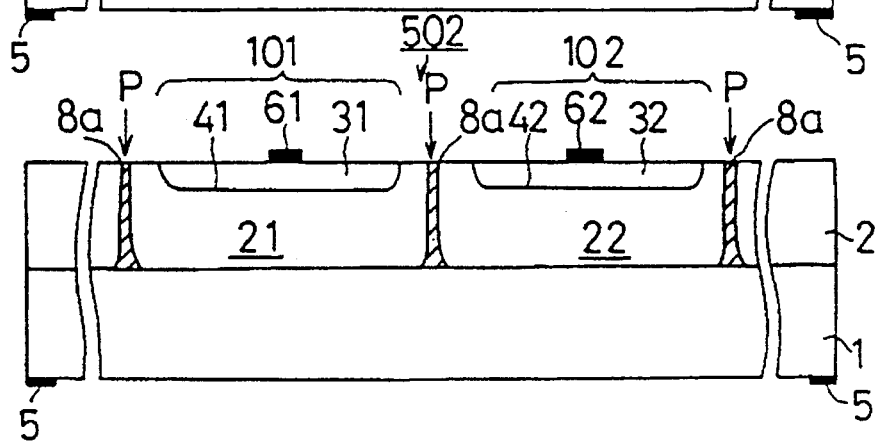

The process steps shown in FIGS. 3(a)–3(c) are identical to those already described with respect to FIGS. 1(a)–1(c) and, therefore, repeated description is not necessary.

In the step of FIG. 3(d), portions of the p type $Cd_{0.2}Hg_{0.8}Te$ layer 2 to be pixel boundaries are irradiated with a proton beam having an energy of 3 MeV at a dose rate of $1 \times 10^9$ p/cm$^2$/sec for five minutes (total dose=$3 \times 10^{11}$ cm$^{-2}$), whereby a $Cd_{0.3}Hg_{0.7}Te$ separation region 8a penetrating through the $Cd_{0.2}Hg_{0.8}Te$ layer 2 and reaching the substrate 1 is produced. This is caused by that the Cd composition of the irradiated portions of the p type $Cd_{0.2}Hg_{0.8}Te$ layer 2 is increased by the dissociation of Hg atoms from those portions due to interaction with the high energy proton. In the proton beam irradiation, however, significantly high energy (3 MeV) is required to completely penetrate the 10 μm thick $Cd_{0.2}Hg_{0.8}Te$ layer 2, compared to electron beam irradiation.

The operation of this infrared detector according to the second embodiment is fundamentally identical to the infrared detector according to the first embodiment. Also in this embodiment, crosstalk is prevented by the minority carrier confinement effect of the potential barrier produced in the separation region 8a having large Cd composition. Further, since the proton beam strikes straight on the p type $Cd_{0.2}Hg_{0.8}Te$ layer 2, narrower separation region 8a than the separation region 8 of the first embodiment is produced.

Figure 4:
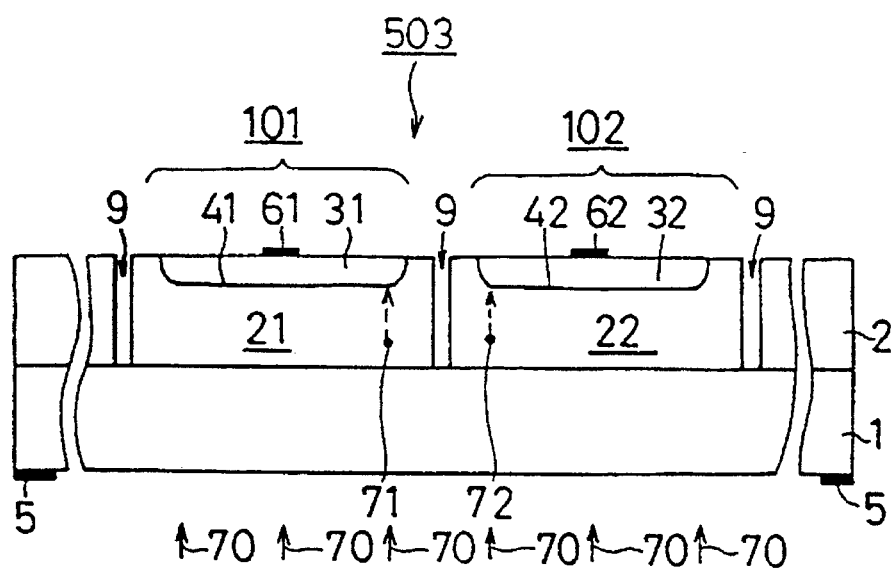
FIG. 4 is a sectional view illustrating an infrared detector in accordance with a third embodiment of the present invention.

FIG. 4 is a sectional view illustrating an infrared detector in accordance with a third embodiment of the present invention. In FIG. 4, an infrared detector 503 includes a groove 9 for separating the respective pixels 101 and 102 from each other.

FIGS. 3(a)–3(c) are sectional views illustrating process steps in a method for fabricating the infrared detector of FIG. 4.

As in the above-described first and second embodiments, after formation of the p type $Cd_{0.2}Hg_{0.8}Te$ layer 2, the n type $Cd_{0.2}Hg_{0.8}Te$ regions 31 and 32, and the positive and negative electrodes 5, 61, and 62, portions of the p type $Cd_{0.2}Hg_{0.8}Te$ layer 2 to be pixel boundaries are subjected to ion milling, whereby the separation groove 9 is produced. Preferably, RIBE (Reactive Ion Beam Etching) or CAIBE (Chemically Assisted Ion Beam Etching) is employed as the ion milling technique.

For example, in the CAIBE method, the separation groove 9 is produced in the following process. Initially, a photoresist film is deposited over the entire surface of the p type $Cd_{0.2}Hg_{0.8}Te$ layer 2, and a 3 μm wide opening is formed in the photoresist film opposite portions to be pixel boundaries. Then, the surface of the $Cd_{0.2}Hg_{0.8}Te$ layer 2 exposed in the opening is subjected to argon ions of 500 eV (Ar$^+$) at the ion concentration of 300 μA/cm$^2$ in flowing $Cl_2$ gas or $Br_2$ gas, adequately exhausted to the atmosphere, whereby the separation groove 9 having a width of 3 μm and a depth of 10 μm, i.e., reaching the CdTe substrate 1, is produced.

The separation groove 9 prevents the electron 71 (72) produced in the pixel 101 (102) by absorption of the incident infrared light 70 from diffusing into adjacent pixels, so that the electron 71 (72) is collected by the pn junction 41 (42) and detected as electric output power. In this way, crosstalk is prevented by the narrow separation groove 9 formed by ion milling. Therefore, the integration density is increased by reducing the space between the adjacent pixels.

Figure 5:
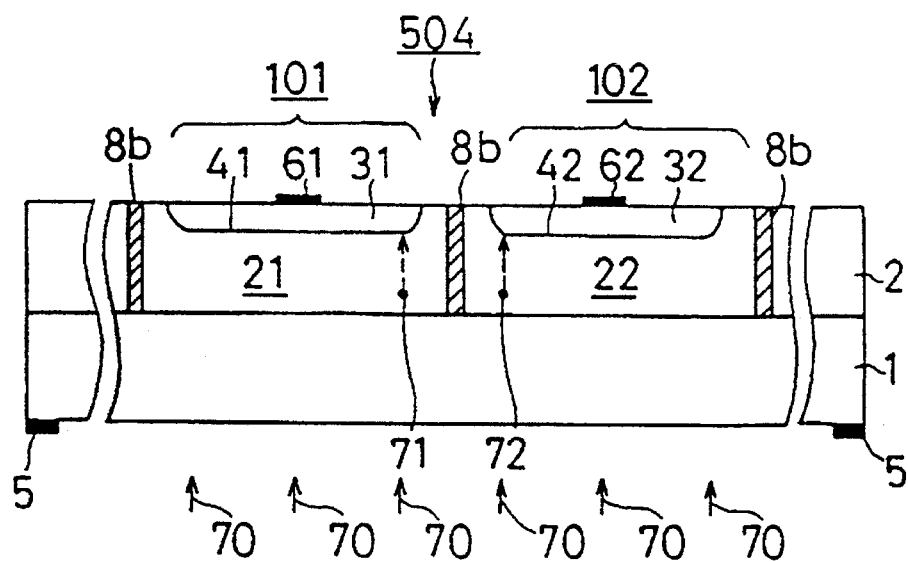
FIG. 5 is a sectional view illustrating an infrared detector in accordance with a fourth embodiment of the present invention.

FIG. 5 is a sectional view illustrating an infrared detector in accordance with a fourth embodiment of the present invention. In the FIG. 5, an infrared detector 504 includes a p type $Cd_{0.3}Hg_{0.7}Te$ separation layer 8b deposited in the separation groove 9 by MOCVD under reduced pressure.

Since the $Cd_{0.3}Hg_{0.7}Te$ separation layer 8b filling in the groove separating the respective pixels 101 and 102 has a band gap energy larger than that of the p type $Cd_{0.2}Hg_{0.8}Te$ layers 21 and 22 serving as effective light responsive layers, electric potential barriers are produced between adjacent pixels according to the same principle as described in the first and second embodiments. Unwanted diffusion of the electron 71 (72) produced in the pixel 101 (102) toward the adjacent pixel is prevented, whereby crosstalk is avoided. In the above-described third embodiment, the generated electron 71 (72) is sometimes dissipated by recombination at the $Cd_{0.2}Hg_{0.7}Te$ layer 21 (22) exposed at the side wall of the separation groove 9. In this case, the electron is not detected as an electric signal output. In this fourth embodiment, since the window layer, i.e., the separation layer 8b, is present in the groove, no recombination of electrons occurs. Further, in this fourth embodiment, since MOCVD is employed for depositing the p type $Cd_{0.3}Hg_{0.7}Te$ separation layer 8b in the groove, the crystalline quality of the separation layer 8b is improved compared to the crystalline quality of the separation regions 8 and 8b according to the first and second embodiments, whereby the electron confining effect is further improved.

Figure 6:
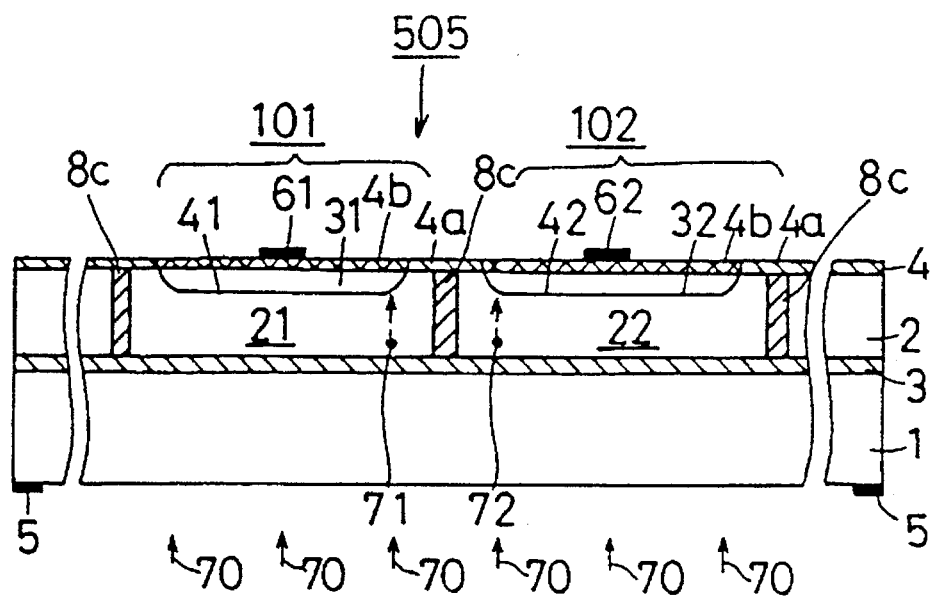
FIG. 6 is a sectional view illustrating an infrared detector in accordance with a fifth embodiment of the present invention.

FIG. 6 is a sectional view illustrating an infrared detector in accordance with a fifth embodiment of the present invention. In FIG. 6, the same reference numerals as those in FIG. 2(a) designate the same or corresponding parts. A p type $Cd_{0.3}Hg_{0.7}Te$ layer 3 is disposed over the entire surface of the CdTe substrate 1. A p type $Cd_{0.2}Hg_{0.8}Te$ layer 2 serving as an effective light responsive layer is disposed on the $Cd_{0.3}Hg_{0.7}Te$ layer 3. The p type $Cd_{0.2}Hg_{0.8}Te$ layer 2 is divided into a plurality of pixel regions 21 and 22 by a p type $Cd_{0.3}Hg_{0.7}Te$ separation region 8c. N type $Cd_{0.2}Hg_{0.8}Te$ regions 31 and 32 are disposed within the p type $Cd_{0.2}Hg_{0.8}Te$ regions 21 and 22, respectively. A p type $Cd_{0.3}Hg_{0.7}Te$ layer 4 is disposed over the p type $Cd_{0.2}Hg_{0.8}Te$ layer 2 including the n type regions 31 and 32 and the separation region 8c. The p type $Cd_{0.3}Hg_{0.7}Te$ layer 4 includes p type $Cd_{0.3}Hg_{0.7}Te$ window regions 4a on the respective p type $Cd_{0.2}Hg_{0.8}Te$ layers 21 and 22, and n type $Cd_{0.3}Hg_{0.7}Te$ window regions 4b on the respective n type $Cd_{0.2}Hg_{0.8}Te$ regions 31 and 32. Those n type regions 31, 32, and 4b are produced by selective diffusion of Hg or selective implantation of boron ions from the surface after formation of the p type $C_{0.3}Hg_{0.7}Te$ layer 4. The n type $Cd_{0.2}Hg_{0.8}Te$ regions 31 and 32 are produced by penetration of Hg atoms or boron ions through the n type $Cd_{0.3}Hg_{0.7}Te$ window regions 4b.

Also in this fifth embodiment, the separation region 8c prevents the electron 71 (72) produced in the pixel 101 (102) from diffusing into the adjacent pixel. In addition, since the window layer 4a at the surface of the p type $Cd_{0.2}Hg_{0.8}Te$ layer 21 (22) reduces the recombination loss at that surface, the electron 71 (72) reaches the pn junction 41 (42) of the pixel 101 (102) with high efficiency and then it is taken out as electric signal. Further, since the negative electrode 61 (62) is produced on the n type $Cd_{0.3}Hg_{0.7}Te$ region 4b having a band gap energy larger than that of the n type $Cd_{0.2}Hg_{0.8}Te$ region 31 (32), electrons stored in the n type $Cd_{0.2}Hg_{0.8}Te$ region 31 (32) are taken out according to the voltage applied to the positive electrode 5 and the negative electrode 61 (62), whereby leakage current due to the dark current effect is suppressed.

Figure 7:
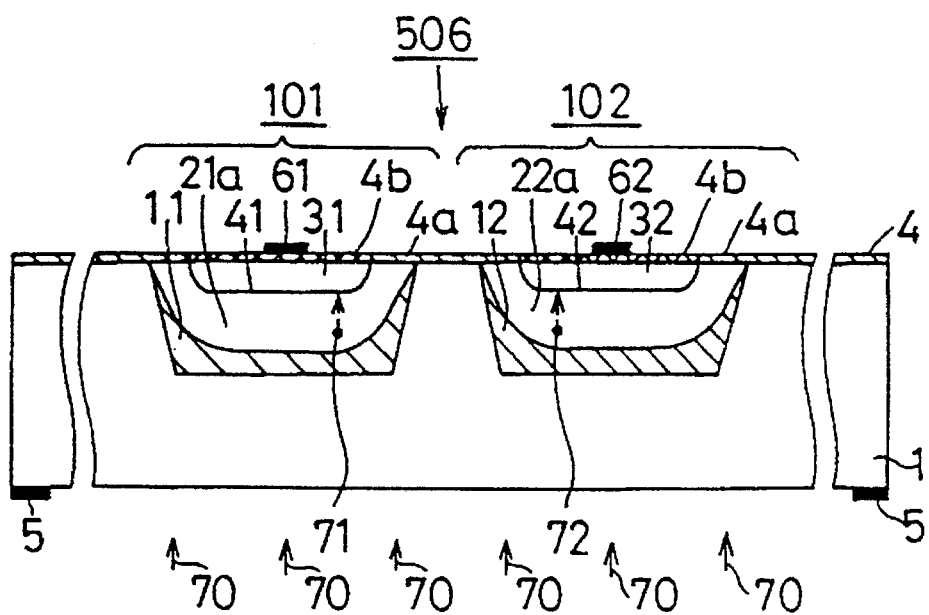
FIG. 7 is a sectional view illustrating an infrared detector in accordance with a sixth embodiment of the present invention.

FIG. 7 is a sectional view illustrating an infrared detector in accordance with a sixth embodiment of the present invention. In FIG. 7, a CdTe substrate 1 includes a plurality of recesses filled with p type $Cd_{0.3}Hg_{0.7}Te$ layers 11 and 12 and p type $Cd_{0.2}Hg_{0.8}Te$ layers 21a and 22b, respectively.

Figure 8:
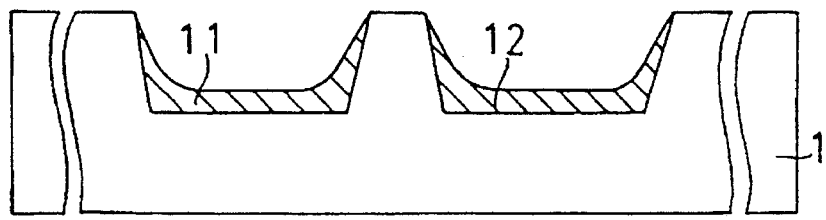
FIGS. 8(a)–8(d) are sectional views illustrating process steps in a method for fabricating the infrared detector of FIG. 7.
Figure 8:
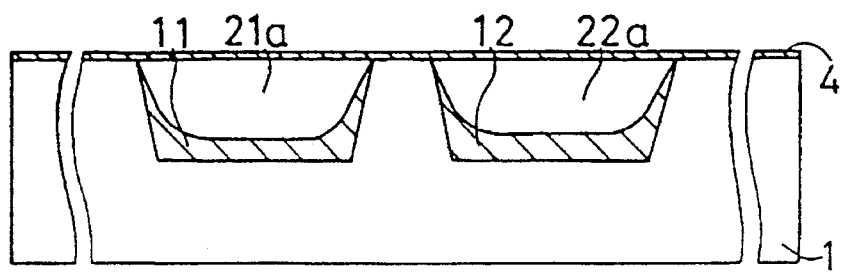
Figure 8:
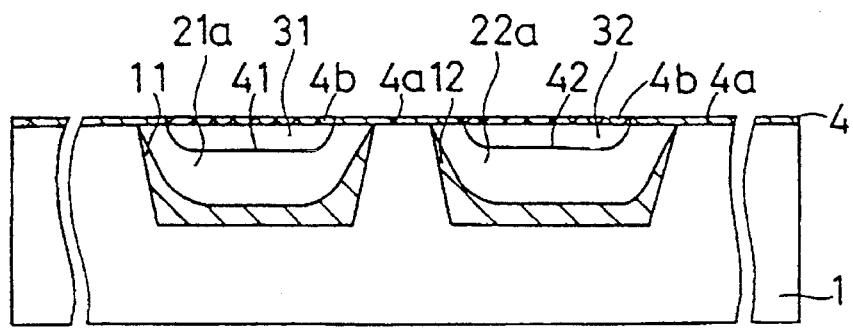
Figure 8:
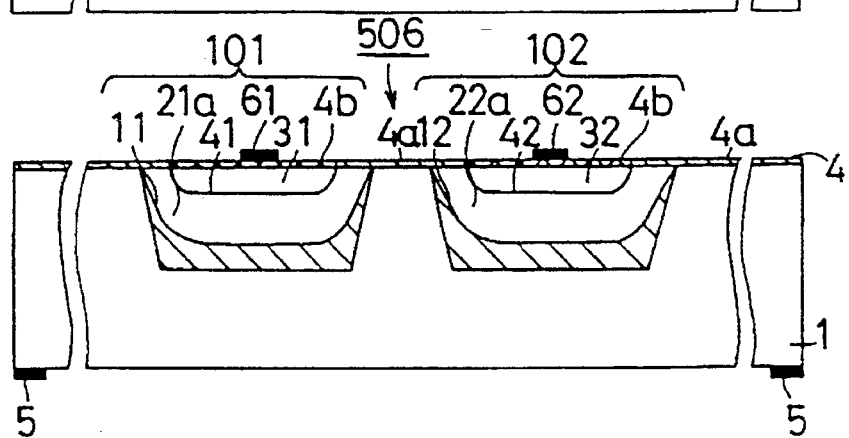

FIGS. 8(a)–8(d) are sectional views illustrating process steps in a method for fabricating the infrared detector of FIG. 7. Initially, as illustrated in FIG. 8(a), a plurality of recesses are formed at the surface of the CdTe substrate 1, and p type $Cd_{0.3}Hg_{0.7}Te$ layers 11 and 12 are grown in these recesses by LPE (Liquid Phase Epitaxy). Thereafter, p type $Cd_{0.2}Hg_{0.8}Te$ layers 21a and 22a are grown in these recesses until the surface of the substrate is flat, and a p type $Cd_{0.3}Hg_{0.7}Te$ layer 4 is grown over the entire surface, preferably by MOCVD (FIG. 8(b)).

In the step of FIG. 8(c), n type $Cd_{0.3}Hg_{0.7}Te$ regions 4b and n type $Cd_{0.2}Hg_{0.8}Te$ regions 31 and 32 are produced at the surface of the p type $Cd_{0.2}Hg_{0.8}Te$ layers 21a and 22a by selective Hg diffusion or B ion implantation.

Finally, a positive electrode 5 and negative electrodes 61 and 62 are produced by vacuum deposition of Cr, Au, or the like to complete the structure of FIG. 8(d).

Since the p type $Cd_{0.2}Hg_{0.8}Te$ layer 21 (22) serving as an effective light responsive region is completely surrounded by the p type $Cd_{0.3}Hg_{0.7}Te$ layer 11 (12), the p type $Cd_{0.3}Hg_{0.7}Te$ region 4a, and the n type $Cd_{0.3}Hg_{0.7}Te$ layer 4b, the electron 71 (72) generated by absorption of infrared light is collected by the pn junction 41 (42) of the pixel 101 (102) with high efficiency. In this embodiment, since the p type $Cd_{0.2}Hg_{0.8}Te$ layers 21 and 22 are produced by LPE that can fill the recesses, a structure in which the p type $Cd_{0.2}Hg_{0.8}Te$ layer is surrounded by the p type $Cd_{0.3}Hg_{0.7}Te$ layer is easily produced as compared to the above-described fifth embodiment of the invention.

Figure 9:
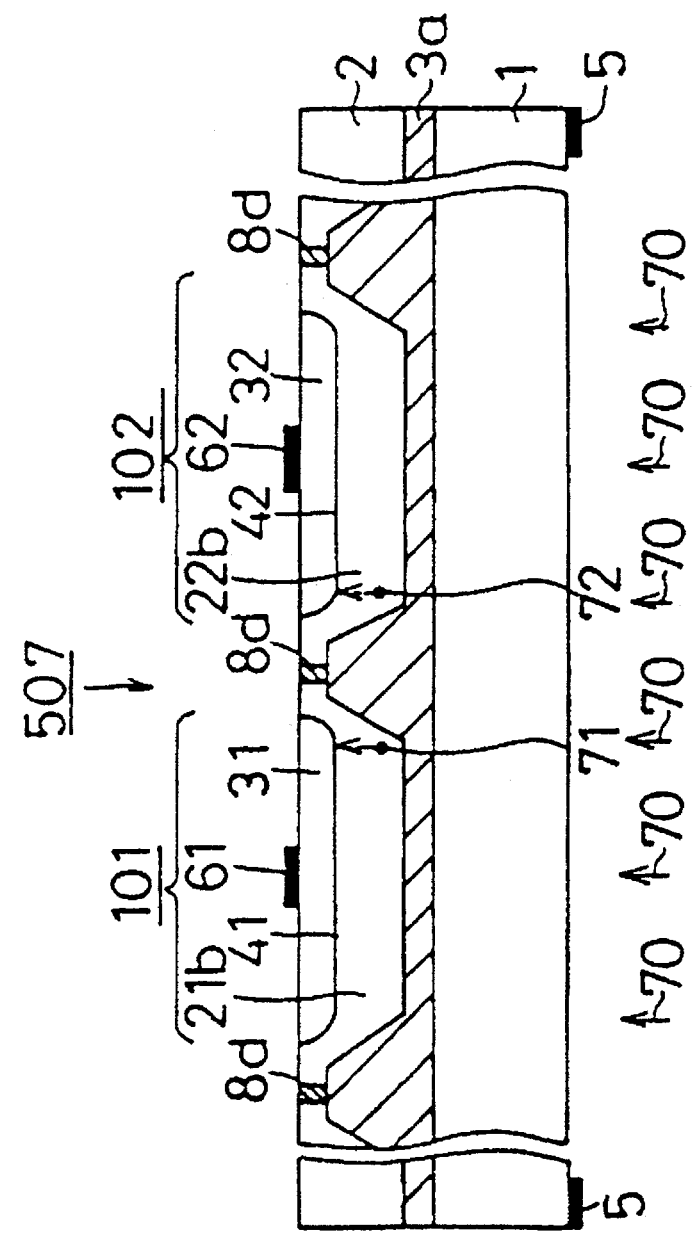
FIG. 9 is a sectional view illustrating an infrared detector in accordance with a seventh embodiment of the present invention.

FIG. 9 is a sectional view illustrating an infrared detector in accordance with a seventh embodiment of the present invention. In FIG. 9, a p type $Cd_{0.3}Hg_{0.7}Te$ layer 3a having a plurality of recesses is disposed on the p type CdTe substrate 1. A p type $Cd_{0.2}Hg_{0.8}Te$ layer 2 serving as an effective light responsive region is disposed on the p type $Cd_{0.3}Hg_{0.7}Te$ layer 3a. The p type $Cd_{0.2}Hg_{0.8}Te$ layer 2 is divided into a plurality of portions 21b and 22b for the respective pixels 101 and 102 by a p type $Cd_{0.3}Hg_{0.7}Te$ separation layer 8d that is in contact with part of the p type $Cd_{0.3}Hg_{0.7}Te$ layer 3a between the recesses.

FIGS. 10(a)–10(d) are sectional views illustrating process steps in a method for fabricating the infrared detector of FIG. 9.

Figure 10:
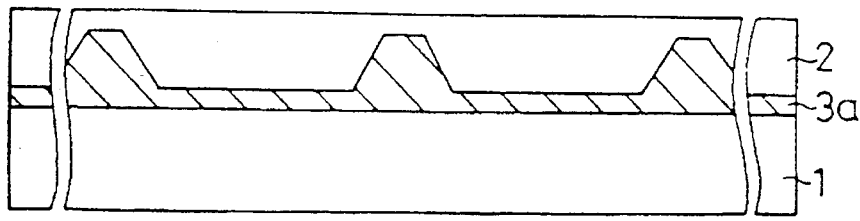
FIGS. 10(a)–10(d) are sectional views illustrating process steps in a method for fabricating the infrared detector of FIG. 9.
Figure 10:
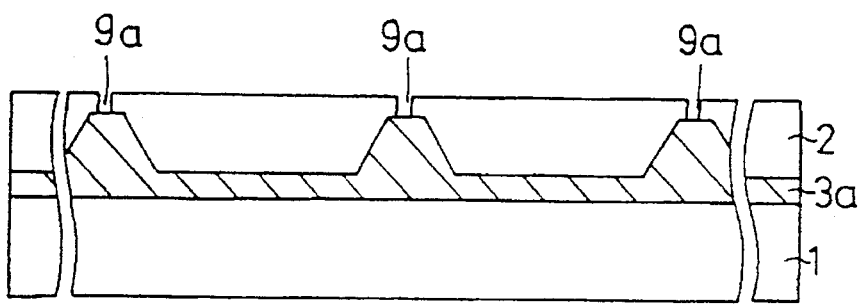
Figure 10:
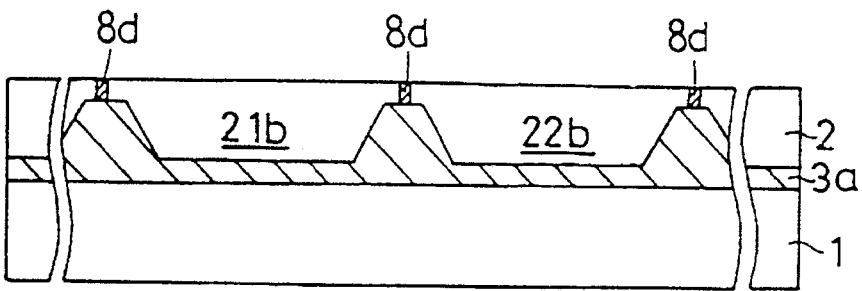
Figure 10:
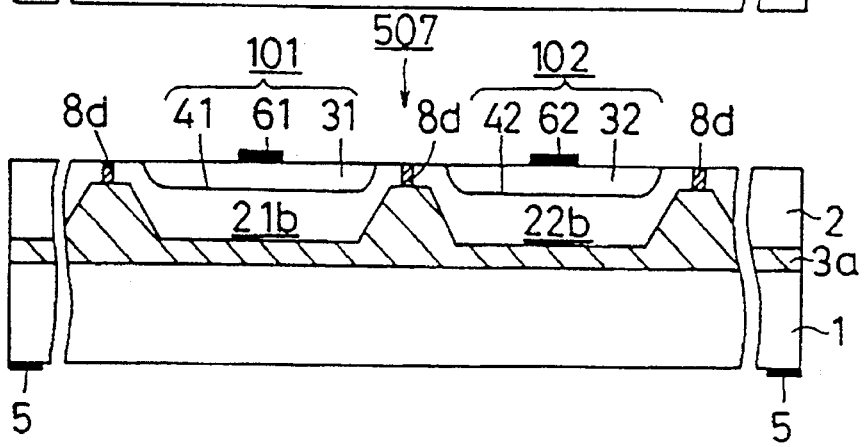

Initially, as illustrated in FIG. 10(a), a p type $Cd_{0.3}Hg_{0.7}Te$ layer 3a is formed on the p type CdTe substrate 1, and a plurality of recesses are formed at the surface of the p type $Cd_{0.3}Hg_{0.7}Te$ layer, followed by deposition of a p type $Cd_{0.2}Hg_{0.8}Te$ layer 2 by LPE until a flat surface is attained.

Thereafter, portions of the p type $Cd_{0.2}Hg_{0.8}Te$ layer 2 to be pixel boundaries, opposite portions of the $Cd_{0.3}Hg_{0.7}Te$ layer 3a between the recesses, are subjected to ion milling, producing a separation groove 9a (FIG. 10(b)).

Then, the separation groove 9a is filled with a p type $Cd_{0.3}Hg_{0.7}Te$ layer 8d (FIG. 10(c)).

To complete the structure of FIG. 10(d), n type regions 31 and 32, n side electrodes 61 and 62, and a p side electrode 5 are produced by the same processing as described above.

In this embodiment, as in the above-described sixth embodiment, the n type separation layer 8d confines minority carriers (electrons 71 and 72) in the respective pixels 101 and 102 with high efficiency, so that crosstalk is avoided. In addition, since the separation groove 9a formed by ion milling is shallow, the ion milling process and the separation layer depositing process are facilitated, whereby the separation of pixels is easily carried out.

Figure 11:
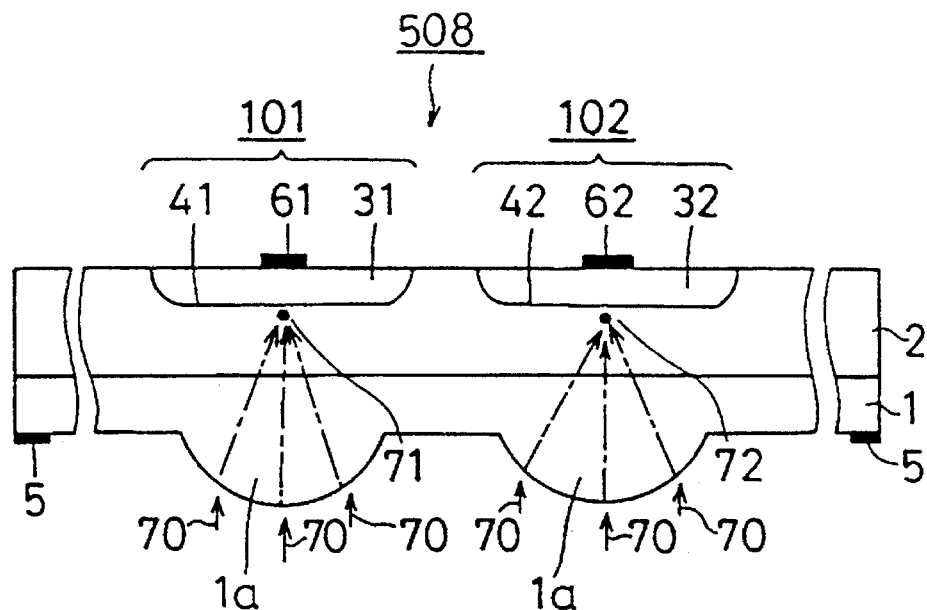
FIG. 11 is a sectional view illustrating an infrared detector in accordance with an eighth embodiment of the present invention.

FIG. 11 is a sectional view illustrating an infrared detector in accordance with an eighth embodiment of the present invention. In FIG. 11, an infrared detector 508 includes convex lenses 1a on the light incident surface of the p type CdTe substrate 1, opposite the respective p type $Cd_{0.2}Hg_{0.8}Te$ layers 31 and 32 serving as effective light responsive regions. Each convex lens 1a is designed so that incident light on that lens is focused on a position in the center of an n type $Cd_{0.2}Hg_{0.8}Te$ region and in the vicinity of a corresponding pn junction.

In this structure, since infrared light 70 incident on the lens 1a is refracted, a lot of electrons are produced in the center portion of the pixel 101 (102) in the vicinity of the pn junction 41 (42), and these electrons are immediately collected by the pn junction 41 (42). Therefore, the unwanted diffusion of electrons toward the adjacent pixels is significantly suppressed, i.e., crosstalk is significantly reduced.

In this embodiment of the invention, since the convex lens 1a is disposed on the light incident surface of the substrate 1 opposite each pixel, electrons are produced in the vicinity of the pn junction of the pixel, whereby crosstalk is suppressed even when the space between adjacent pixels is reduced.

Figure 12:
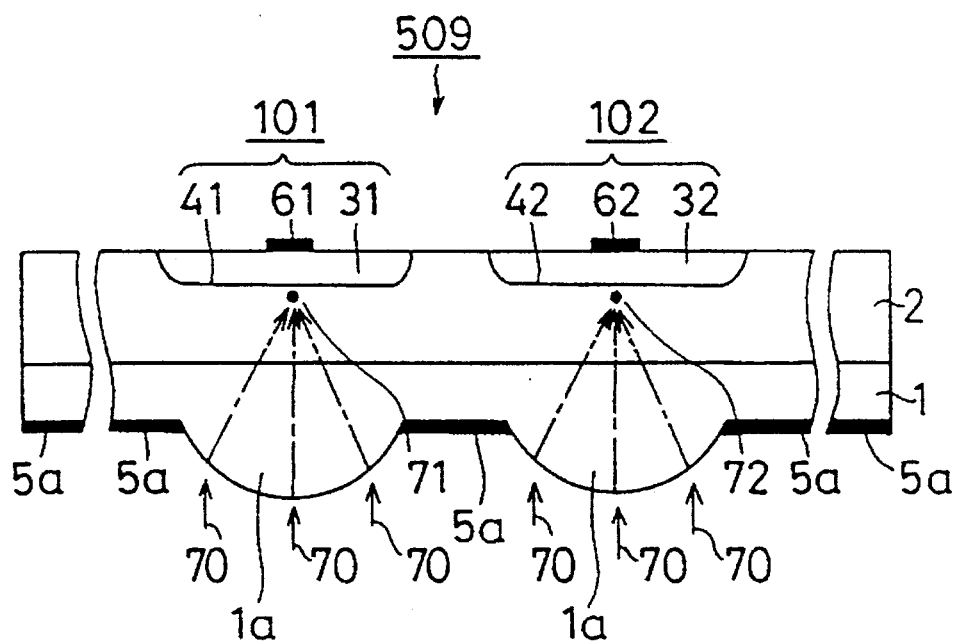
FIG. 12 is a sectional view illustrating an infrared detector in accordance with a ninth embodiment of the present invention.

FIG. 12 is a sectional view illustrating an infrared detector in accordance with a ninth embodiment of the present invention. An infrared detector 509 according to this ninth embodiment is identical to the infrared detector 508 shown in FIG. 11 except that portions of the light incident surface of the substrate 1 where the convex lenses 1a are absent are covered with a p side electrode 5a.

In this structure, infrared light 70 enters in the p type $Cd_{0.2}Hg_{0.8}Te$ layer 2 only from the surfaces of the convex lenses 1a. The infrared light 70 incident on the pixel 101 (102) is focused on a position in the vicinity of the pn junction 41 (42) by the lens 1a, so that electrons are produced in the center region of the pixel in the vicinity of the pn junction. In the infrared detector 508 shown in FIG. 11 according to the eighth embodiment, crosstalk might occur from light incident on the surface of the substrate 1 between the lenses 1a. In this ninth embodiment, however, send only infrared light incident on the pixels 101 and 102 is detected with high efficiency, crosstalk is further reduced. Further, since the p side electrode 5a is interposed between the p type $Cd_{0.2}Hg_{0.8}Te$ layers 31 and 32 serving as effective light responsive regions, effective infrared light incident on the respective pixels is not intercepted by the electrode 5a, in other words, the electrode 5a does not reduce the sensitivity of the infrared detector.

Figure 13:
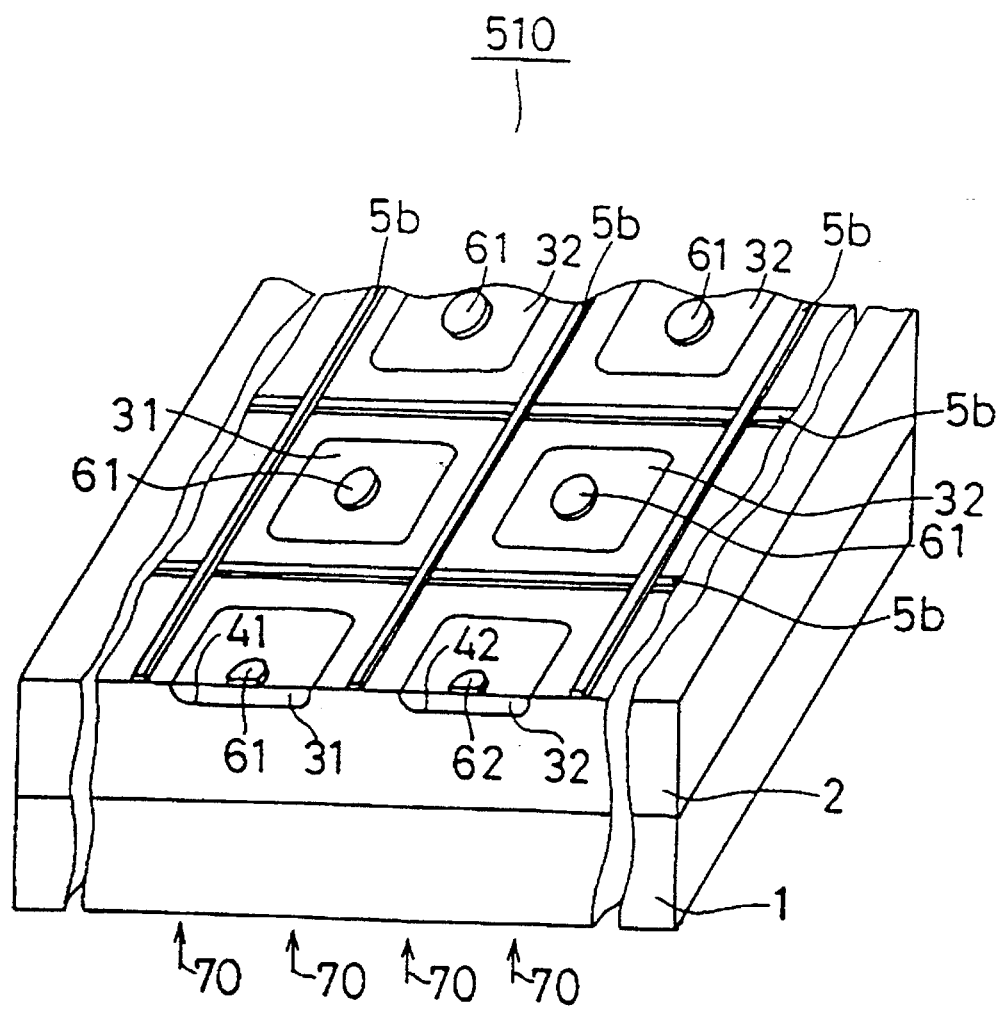
FIG. 13 is a perspective view illustrating an infrared detector in accordance with a tenth embodiment of the present invention.

FIG. 13 is a perspective view, partly in section, illustrating an infrared detector in accordance with a tenth embodiment of the present invention. This infrared detector is fundamentally identical to the prior art infrared detector shown in FIG. 25 except that a lattice-shaped p side electrode 5b is disposed on the p type $Cd_{0.2}Hg_{0.8}Te$ layer 2, surrounding each pixel.

Figure 25:
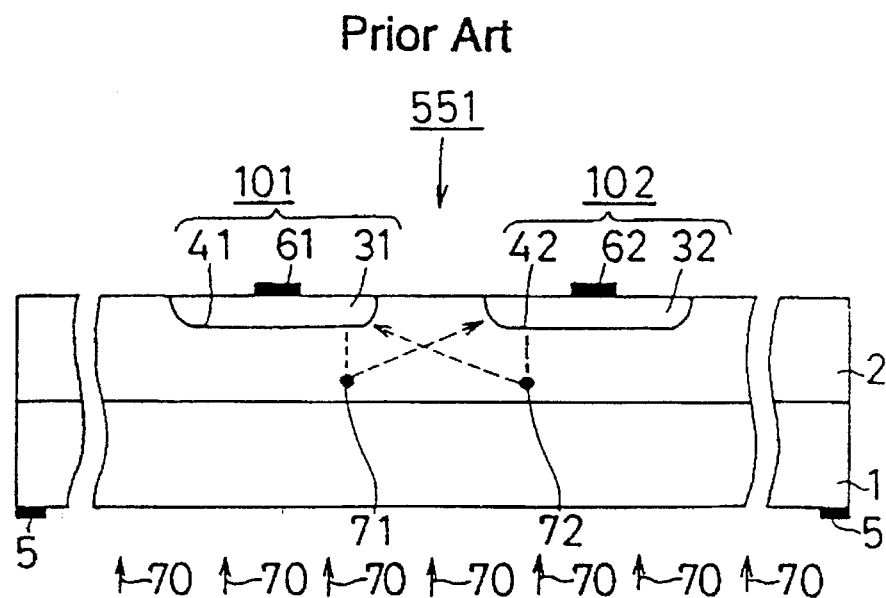
FIG. 25 is a sectional view illustrating an infrared detector in accordance with the prior art.
Figure 26:
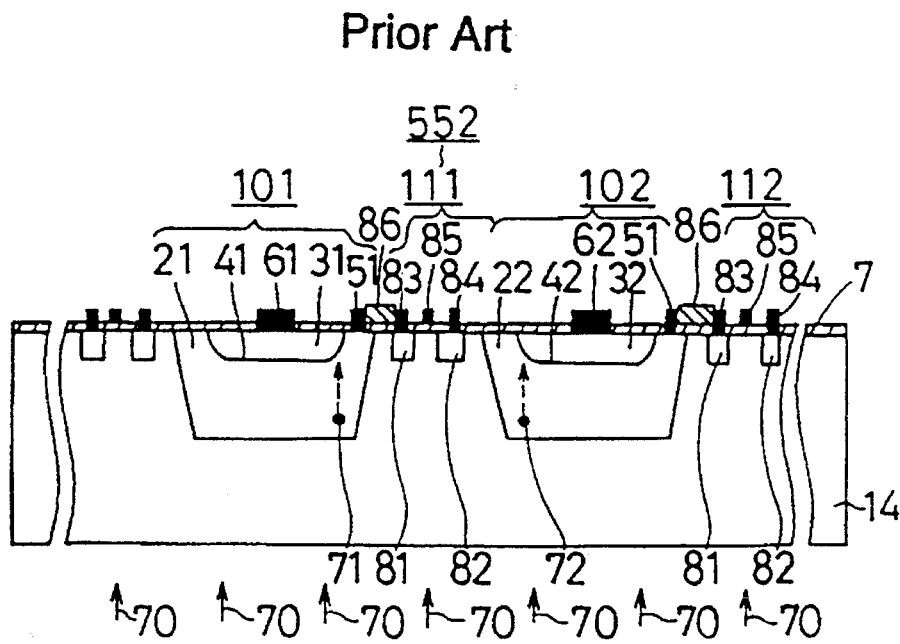
FIG. 26 is a sectional view illustrating an infrared detector in accordance with the prior art.

In this tenth embodiment, since the lattice-shaped p side electrode 5b is disposed on the p type $Cd_{0.2}Hg_{0.8}Te$ layer 2, the internal resistance is reduced compared to the prior art device shown in FIG. 25. More specifically, in the prior art detector including two-dimensionally arranged pixels, current produced in pixels in the center of the two-dimensional array is taken out from the frame-shaped p side electrode through the p type CdTe substrate 1 having a relatively high resistivity of about 100 Ω, so that the internal resistance is significantly increased. In this tenth embodiment of the invention, however, since the p type electrode 5b is stretched around the respective pixels, the internal resistance is significantly reduced. Further, the surface recombination rate is increased in a region of the $Cd_{0.2}Hg_{0.8}Te$ layer 2 under the electrode 5b, so that electrons diffusing toward the adjacent pixels are captured in this region, whereby crosstalk is reduced. When this electrode structure is applied to the infrared detectors according to the first, second, and fourth embodiments, crosstalk is significantly reduced.

Figure 14:
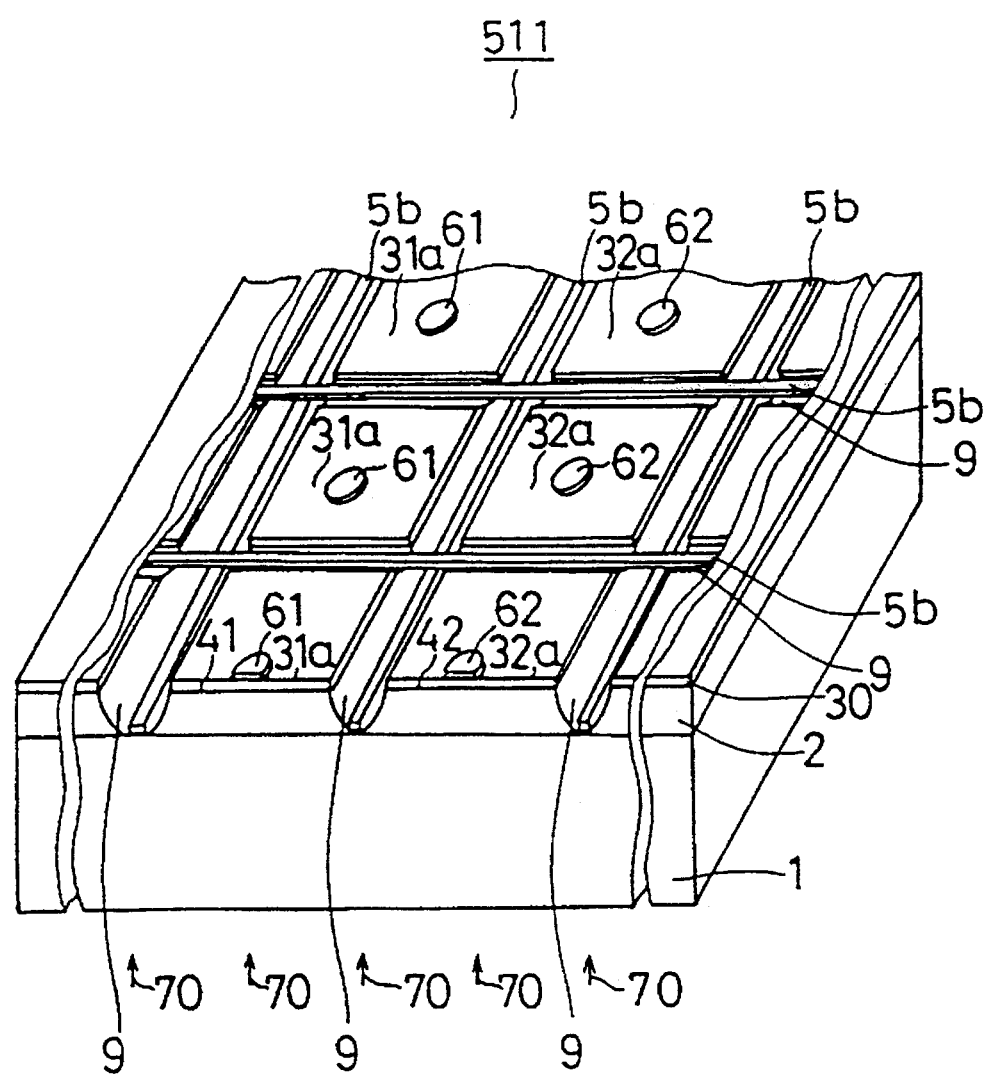
FIG. 14 is a perspective view illustrating an infrared detector in accordance with an eleventh embodiment of the present invention.

FIG. 14 is a perspective view, partly in section, illustrating an infrared detector in accordance with an eleventh embodiment of the present invention. In the figure, reference numerals 31a and 32a designate n type $Cd_{0.2}Hg_{0.8}Te$ layers disposed on the p type $Cd_{0.2}Hg_{0.8}Te$ layers 2 corresponding to the respective pixels.

The structure of FIG. 14 is fabricated in the following process. Initially, a p type $Cd_{0.2}Hg_{0.8}Te$ layer 2 is formed on the p type CdTe substrate 1 and, thereafter, an n type $Cd_{0.2}Hg_{0.8}Te$ region 30 is produced at the entire surface of the p type $Cd_{0.2}Hg_{0.8}Te$ layer 2 by Hg diffusion or B ion implantation. Then, a lattice-shaped separation groove 9 is formed by etching so that each pixel region is shaped in a mesa. Thereafter, a lattice-shaped p side electrode 5b is produced in the separation groove 9.

In this eleventh embodiment, the n type $Cd_{0.2}Hg_{0.8}Te$ region 30 is formed over the entire surface of the p type $Cd_{0.2}Hg_{0.8}Te$ layer 2 and divided into a plurality of n type $Cd_{0.2}Hg_{0.8}Te$ regions 31a and 32a of the respective pixels by the separation groove 9. Therefore, production of pn junctions in the respective pixels and separation of the respective pixels are facilitated. Further, the lattice-shaped electrode 5b reduces the internal resistance.

Figure 15:
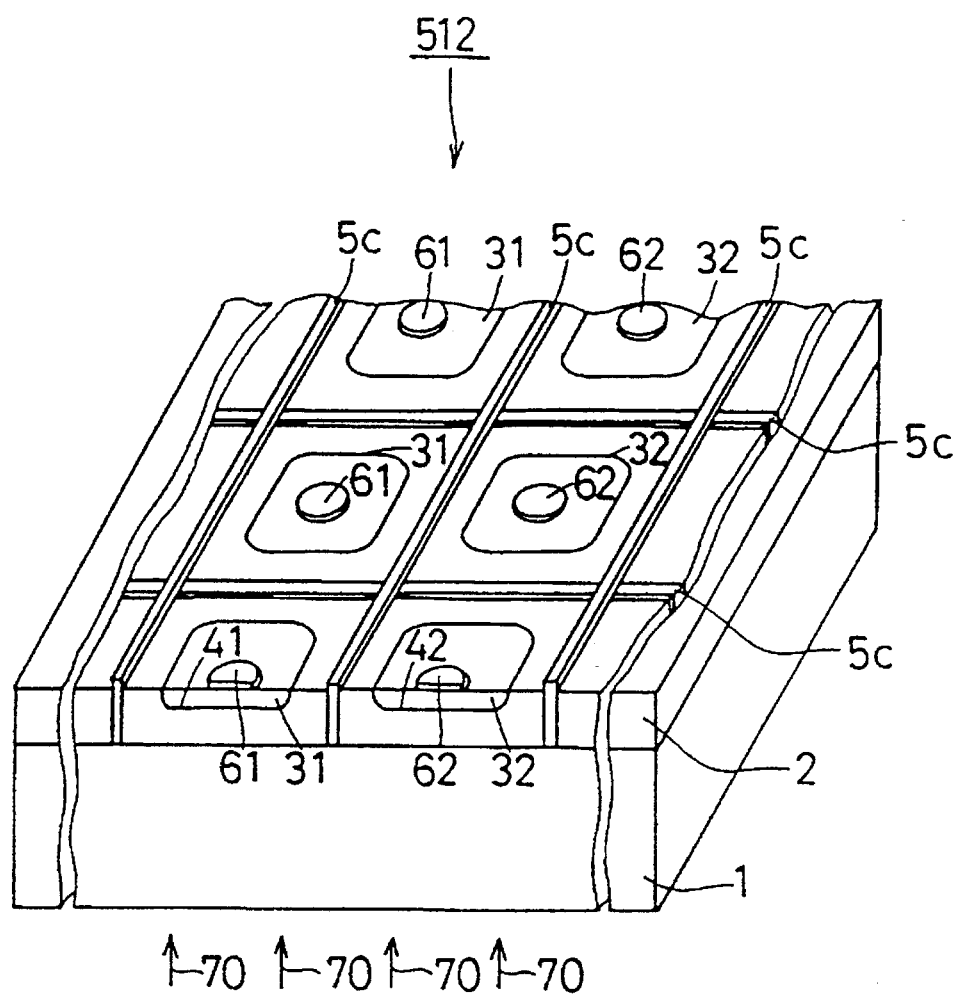
FIG. 15 is a perspective view illustrating an infrared detector in accordance with a twelfth embodiment of the present invention.

FIG. 15 is a perspective view, partly in section, illustrating an infrared detector in accordance with a twelfth embodiment of the present invention. An infrared detector 512 of this twelfth embodiment is fundamentally identical to the infrared detector 503 shown in FIG. 4 except that a p side electrode 5c is disposed in the lattice-shaped separation groove 9.

In this structure, in addition to the prevention of crosstalk by the separation groove 9, the internal resistance is reduced by the lattice-shaped electrode 5c.

Figure 16A:
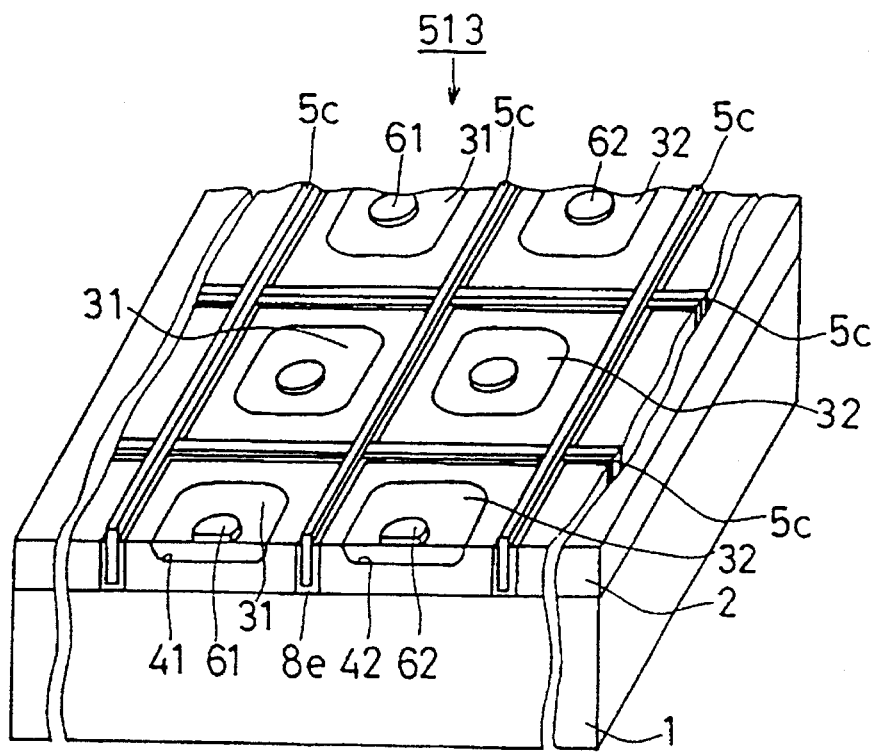
FIGS. 16(a) and 16(b) are a perspective view and a sectional view illustrating an infrared detector in accordance with a thirteenth embodiment of the present invention.
Figure 16B:
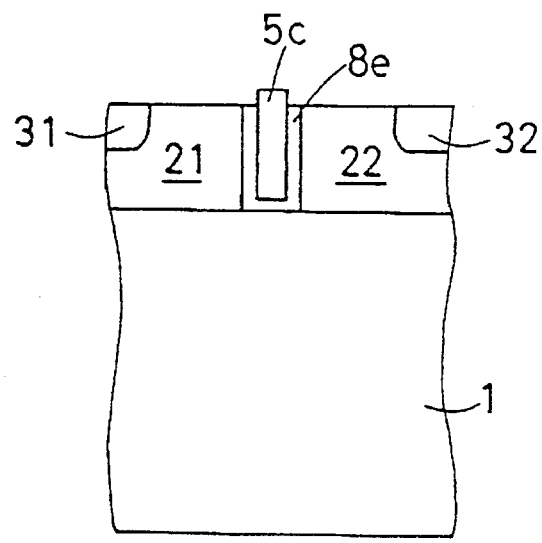

FIG. 16(a) is a perspective view, partly in section, illustrating an infrared detector in accordance with a thirteenth embodiment of the present invention, and FIG. 16(b) is a sectional view of a part of the infrared detector. An infrared detector 513 according to this thirteenth embodiment is identical to the infrared detector 512 shown in FIG. 15 except that a thin $Cd_{0.3}Hg_{0.7}Te$ layer 8e is interposed between the p type $Cd_{0.2}Hg_{0.8}Te$ layer 2 and the p side electrode 5c. In the production, after formation of the separation groove 9 by ion milling or the like, the $Cd_{0.3}Hg_{0.7}Te$ layer 8e is deposited in the groove by MOCVD under reduced pressure. A 500 Å thick $Cd_{0.3}Hg_{0.7}Te$ layer 8e is sufficient to achieve the carrier confinement effect.

In this thirteenth embodiment, since the lattice-shaped electrode 5c is embedded in the $Cd_{0.3}Hg_{0.7}Te$ layer 8e that fills in the separation groove, loss due to recombination of carriers at the side wall of the groove is prevented.

Figure 17:
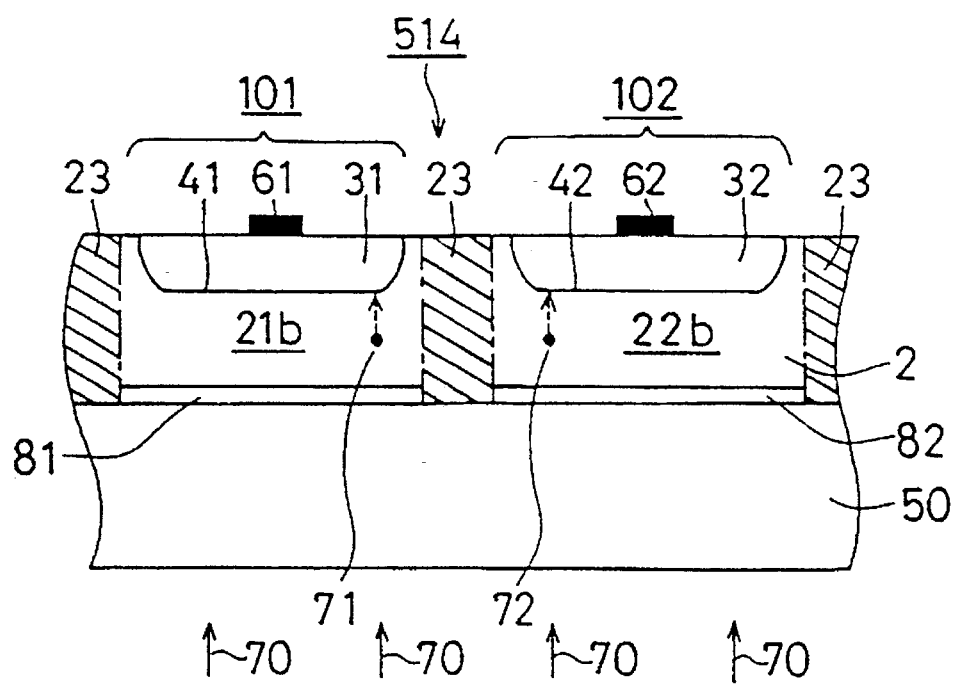
FIG. 17 is a sectional view illustrating an infrared detector in accordance with a fourteenth embodiment of the present invention.

FIG. 17 is a sectional view illustrating an infrared detector in accordance with a fourteenth embodiment of the present invention. In FIG. 17, an infrared detector 514 includes a p type silicon monocrystalline substrate 50. Island-shaped p type GaAs layers 81 and 82 are disposed on the substrate 50. A p type CdHgTe layer 2 is disposed over the entire surface of the substrate 50 having the p type GaAs layers 81 and 82. P type CdHgTe regions 21b and 22b of the p type CdHgTe layer 2 are disposed opposite the p type GaAs layers 81 and 82, respectively, and a high defect density region 23 of that layer 2 is disposed opposite part of the substrate 50 where the p type GaAs layers 81 and 82 are absent.

FIGS. 18(a)–18(d) are sectional views illustrating process steps in a method for fabricating the infrared detector shown in FIG. 17.

Figure 18:
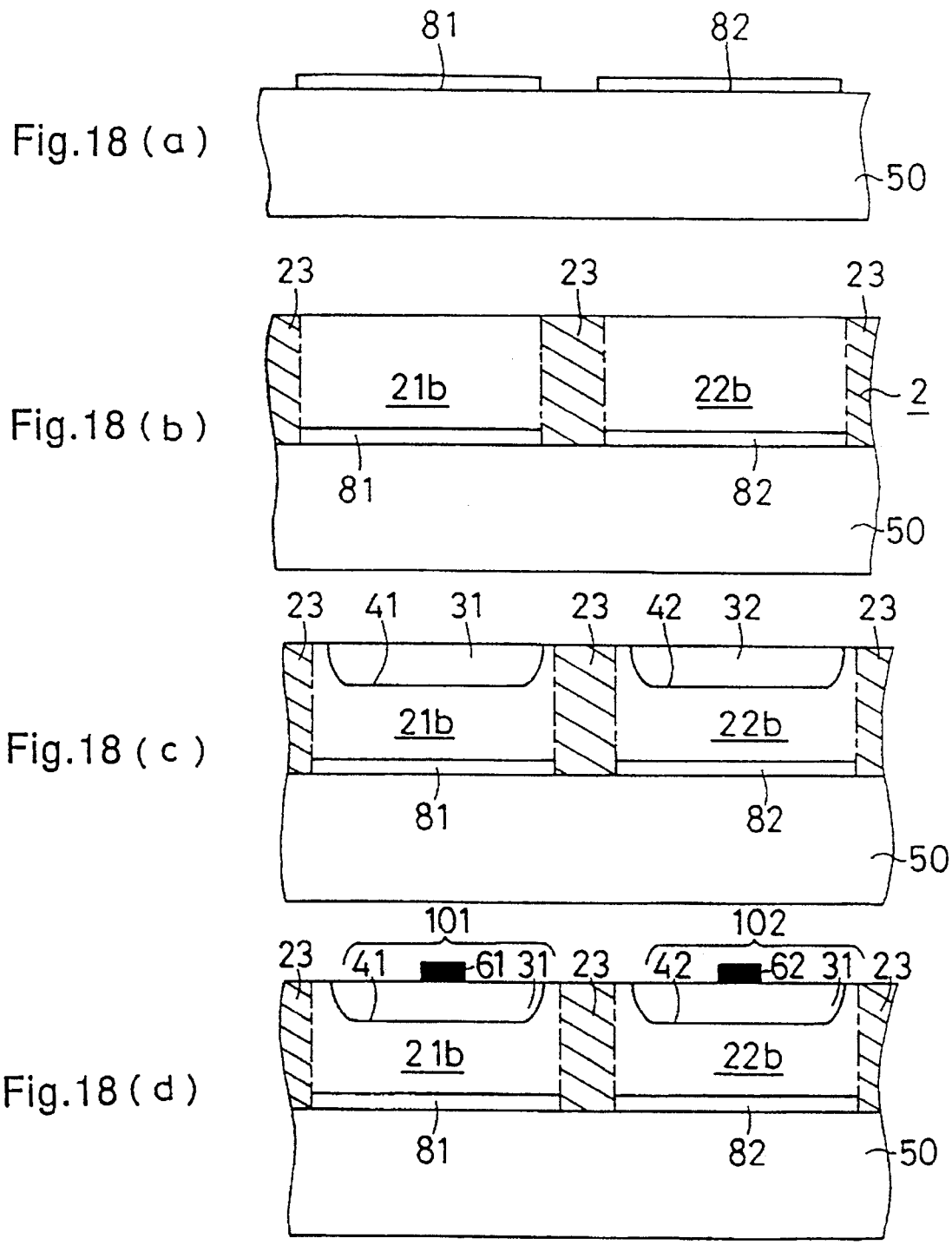
FIGS. 18(a)–18(d) are sectional views illustrating process steps in a method for fabricating the infrared detector of FIG. 17.

Initially, as illustrated in FIG. 18(a), island-shaped p type GaAs layers 81 and 82 are produced on the p type silicon substrate 50. More specifically, a GaAs layer is grown over the entire surface of the silicon substrate 50 and patterned by conventional photolithography and etching techniques. Preferably, the GaAs layer is grown on the silicon substrate by MOCVD or MBE (Molecular Beam Epitaxy), and a buffer layer, such as a low-temperature buffer layer or a strained superlattice buffer layer, is grown in advance of the growth of the GaAs layer to reduce the defect density of the GaAs layer. Alternatively, a silicon nitride film or a silicon oxide film is deposited over the entire surface of the silicon substrate 50 and patterned in a lattice shape by conventional photolithography and etching technique to selectively expose the silicon substrate. Thereafter, a GaAs layer is selectively grown on the exposed portions of the silicon substrate by MOCVD or MBE, followed by removal of the silicon nitride or silicon oxide film by etching.

After formation of the island-shaped GaAs layers 81 and 82 on the p type silicon substrate 50, a p type $Cd_xHg_{1-x}Te$ layer 2 is grown on the substrate 50 with the GaAs layers 81 and 82, preferably by MOCVD or MBE. Before the growth of the p type CdHgTe layer 2, a CdTe buffer layer (not shown) and an HgTe-CdTe superlattice buffer layer (not shown) are grown on the substrate. As a result of this growth process, the p type CdHgTe layer 2 comprises regions 21b and 22b respectively grown on the GaAs layers 81 and 82 and a region 23 grown directly on the silicon substrate 50 (FIG. 18(b)).

In the step of FIG. 18(c), n type CdHgTe regions 31 and 32 are produced at the surface of the p type CdHgTe regions 21b and 22b, respectively, by ion implantation or impurity diffusion.

To complete the structure of FIG. 18(d), negative electrodes 61 and 62 are formed on the n type regions 31 and 32, respectively, by metal deposition or the like and a positive electrode (not shown) is formed on the light incident surface of the substrate 50.

A description is given of the operation.

In FIG. 17, infrared light 70 having a wavelength of about 10 μm is incident on the rear surface of the silicon substrate 50. The incident light is absorbed in the p type CdHgTe layers 21b and 22b corresponding to the pixels 101 and 102, and electrons 71 and 72 as minority carriers are produced, respectively. The electron 71 reaches the pn junction 41 of the pixel 101 and is detected as output power of the pixel 101. This electron 71 never reaches the pn junction 42 of the adjacent pixel 102. The principle of this operation will be described in more detail.

When a crystal layer is grown on a substrate comprising a material different from the crystal layer, a difference in lattice constants between the material of the crystal layer and the material of the substrate becomes a serious problem. If the difference in the lattice constants is too large, a lattice defect called a "mismatch dislocation" occurs in the grown crystal layer. When a GaAs layer is grown on a silicon substrate as in this fourteenth embodiment of the invention, it has been definitely shown by latest study that the defect density of the grown GaAs layer is reduced to ~1×10$^6$/cm$^2$ by interposing a buffer layer grown at a low temperature or a strained superlattice buffer layer between the GaAs layer and the silicon substrate. On the other hand, in crystal growth of CdHgTe, CdHgTe grown on GaAs includes fewer crystal defects than CdHgTe grown on Si because the lattice constant of GaAs (5.653Å) is nearer to the lattice constant of CdHgTe (6.464Å) than the lattice constant of Si (5,431Å).

Further, in recent research, it has been determined that the defect density of a CdHgTe layer grown on a GaAs substrate is reduced to ~1×10$^6$/cm$^2$ by interposing a CdTe buffer layer and an HgTe-CdTe superlattice buffer layer between the CdHgTe layer and the GaAs substrate. On the other hand, when a CdHgTe layer is growth on a Si substrate, the defect density of the grown CdHgTe layer is of 10$^8$–10$^9$/cm$^2$ even when any buffer layer is interposed. This result is attributed to the larger difference in the lattice constants between Si and CdHgTe.

In this embodiment of the invention, the pixels 101 and 102 are formed in the regions 21b and 22b of the CdHgTe layer 2 grown on the GaAs layers 81 and 82, respectively, and these pixels are separated from each other by the region 23 of the CdHgTe layer 2 grown on the Si substrate 50. That is, these pixels 101 and 102 are produced in the low defect density region (~1×10$^6$/cm$^2$) of the CdHgTe layer 2 and separated from each other by the high defect density region (10$^8$–10$^9$/cm$^2$) of the CdHgTe layer 2. The electron 71 produced in the CdHgTe layer 21b of the pixel 101 by absorption of infrared light should pass through the high defect density region 23 before reaching the pn junction 42 of the adjacent pixel 102. In this structure, since the high-density crystal defect of the region 23 serves as a trap for electrons, the electron 71 never reaches the CdHgTe layer 22b of the adjacent pixel 102 across the high defect density region 23.

Therefore, the electron 71 produced in the pixel 101 never reaches the pn junction 42 of the pixel 102, so that crosstalk, i.e., misjudgment of the incidence position of infrared light, never occurs. Further, since the space between the adjacent pixels depends on the patterning precision of the GaAs layer, the space can be reduced to several microns, resulting in a highly-integrated infrared detector.

According to this fourteenth embodiment of the invention, the high defect density region 23 is present between the adjacent pixels, and electrons generated in one pixel and diffusing toward the adjacent pixel are recombined and trapped in the high defect density region 23, whereby crosstalk is avoided.

Figure 19:
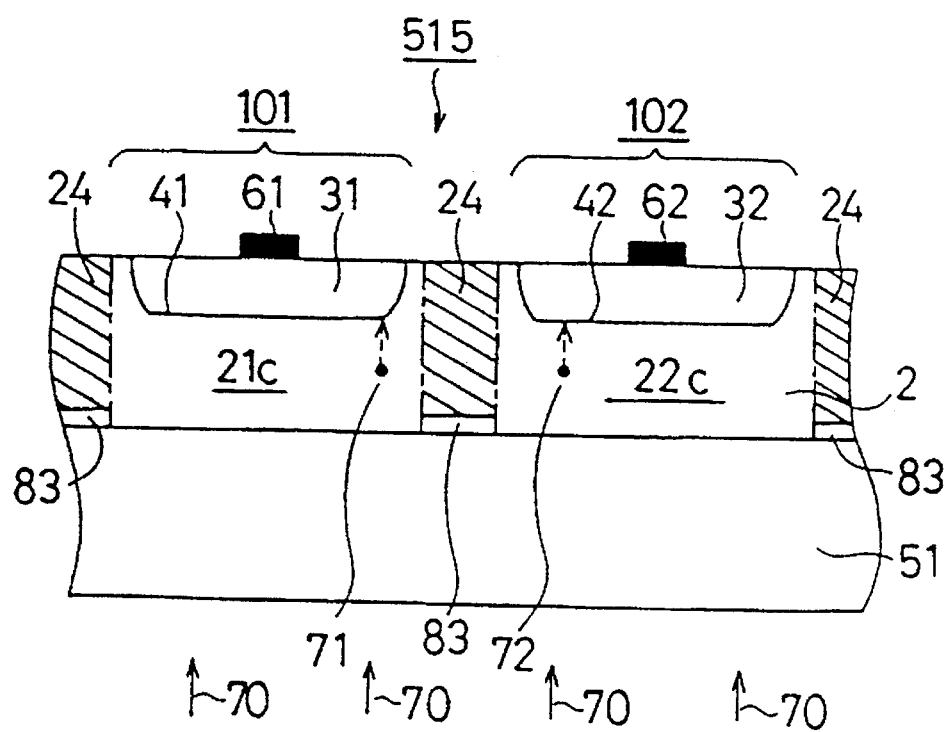
FIG. 19 is a sectional view illustrating an infrared detector in accordance with a fifteenth embodiment of the present invention.

FIG. 19 is a sectional view illustrating an infrared detector in accordance with a fifteenth embodiment of the present invention. In FIG. 19, an infrared detector 515 includes a CdTe substrate 51. A lattice-shaped Si layer 83 is disposed on the CdTe substrate 51. A p type CdHgTe layer 2 is disposed on the substrate 51 with the Si layer 83. The p type CdHgTe layer 2 includes regions 21c and 22c grown on the CdTe substrate 51 and a region 24 grown on the Si layer 83.

Figure 20:
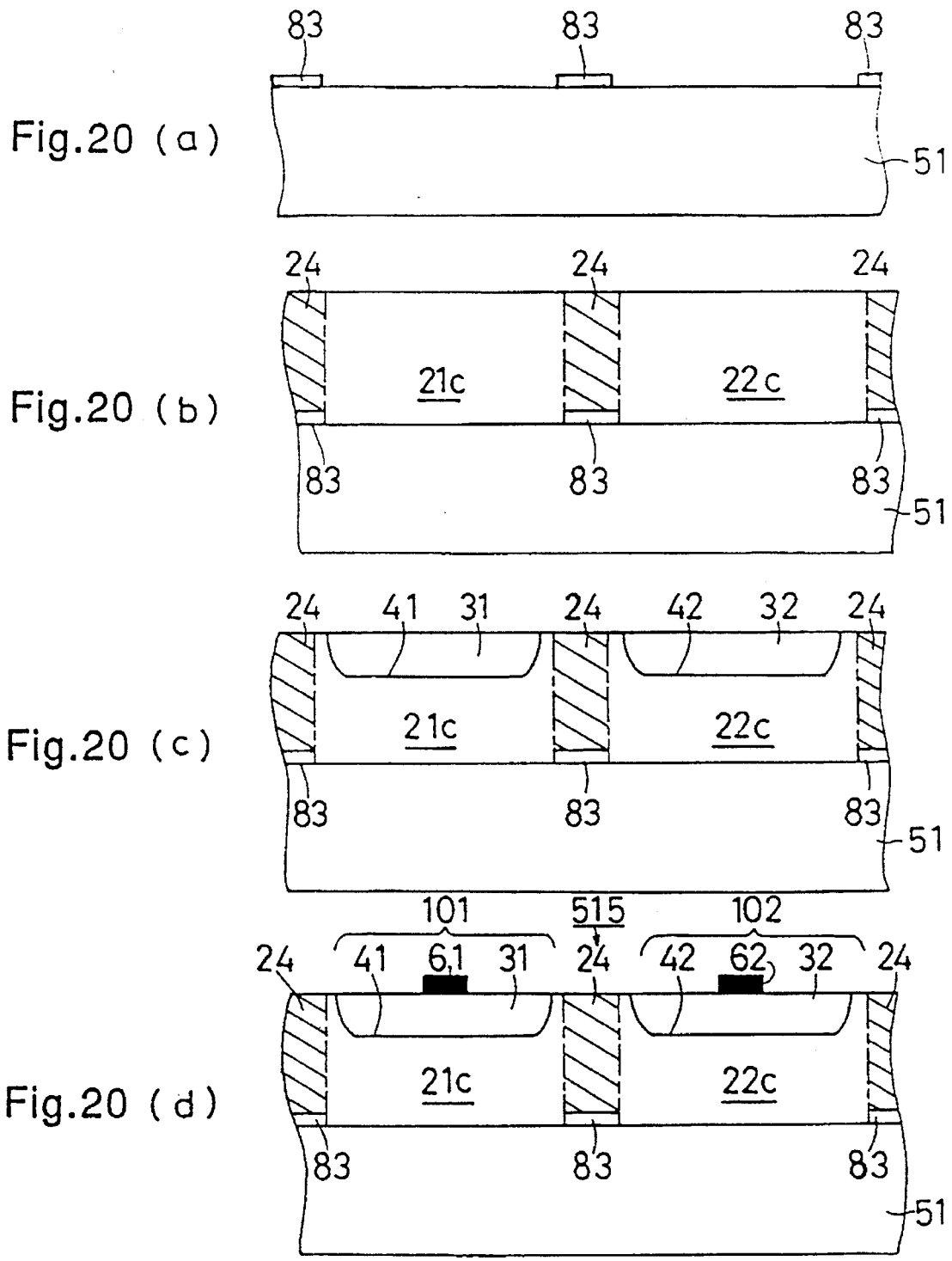
FIGS. 20(a)–20(d) are sectional views illustrating process steps in a method for fabricating the infrared detector of FIG. 19.

FIGS. 20(a)–20(d) are sectional views illustrating process steps in a method for fabricating the infrared detector 515 shown in FIG. 19. Initially, as illustrated in FIG. 20(a), the lattice-shaped Si layer 83 is formed on the CdTe substrate 51. More specifically, an Si layer is deposited over the entire surface of the CdTe substrate 51 by CVD or the like and patterned by conventional photolithography and etching techniques to form the lattice-shaped Si layer 83. Alternatively, a silicon nitride film or a silicon oxide film is deposited over the entire surface of the substrate 51 and patterned by conventional photolithography and etching techniques to selectively expose portions of the CdTe substrate 51. Thereafter, an Si layer is deposited on the exposed portions of the substrate by CVD or the like, followed by removal of the silicon nitride or silicon oxide film by etching, resulting in the lattice-shaped Si layer 83.

In the step of FIG. 20(b), a p type CdHgTe layer 2 is grown on the substrate 51 having the lattice-shaped Si layer 83, preferably by LPE, MOCVD, or MBE. The grown CdHgTe layer 2 comprises regions 21c and 22c grown directly on the CdTe substrate 51 and a region 24 grown on the Si layer 83.

In the step of FIG. 20(c), n type regions 31 and 32 are formed from the surface of the respective regions 21c and 22c of the p type CdHgTe layer 2 by ion implantation or impurity diffusion.

To complete the structure of FIG. 18(d), negative electrodes 61 and 62 are deposited on the n type regions 31 and 32, respectively, and a positive electrode (not shown) is deposited on the light incident surface of the substrate 51.

A description is given of the operation.

In FIG. 19, infrared light 70 having a wavelength of about 10 μm is incident on the rear surface of the CdTe substrate 51. The incident light is absorbed in the p type CdHgTe layers 21c and 22c corresponding to the pixels 101 and 102, producing electrons 71 and 72 as minority carriers, respectively. In this case, the electron 71 reaches the pn junction 41 in the pixel 101 and is detected as output power of the pixel 101. The electron 71 never reaches the pn junction 42 of the adjacent pixel 102. The principle of this operation will be described in more detail.

As described in the fourteenth embodiment of the invention, an CdHgTe layer grown on an Si substrate includes a high density of crystal defects, i.e., $10^8 \sim 10^9/cm^2$. On the other hand, the lattice constant of CdTe is 6.481Å, and this value approximates to the lattice constant of CdHgTe, that is, 6.464Å. Therefore, a CdHgTe layer with a low defect density of $10^6 \sim 10^6/cm^2$ can be grown on the CdTe substrate without interposing a buffer layer.

In this fifteenth embodiment of the invention, the pixels 101 and 102 are present in the CdHgTe regions 21c and 22c grown on the CdTe substrate 51, respectively, and these pixels are separated from each other by the CdHgTe region 24 grown on the lattice-shaped Si layer 83. That is, the pixels 101 and 102 are produced in the low defect density region ($10^5 \sim 10^6/cm^2$), and these pixels are separated from each other by the high defect density region ($10^8 \sim 10^9/cm^2$). The electron 71 produced in the CdHgTe layer 21c of the pixel 101 must pass through the high defect density region 24 to reach the pn junction 42 of the adjacent pixel 102. However, since the high-density crystal defect in that region 24 serves as a trap for electrons, the electron 71 produced in the pixel 101 never reaches the CdHgTe layer 22c of the pixel 102 across the high defect density region 24. Therefore, the electron 71 never reaches the pn junction 42 of the pixel 102, whereby crosstalk is avoided. Further, since the space between adjacent two pixels depends on the patterning precision of the Si layer 83, this process may be applied to production of a high-density infrared detector.

While in the above-described fifteenth embodiment a CdTe substrate is employed, a $Cd_yZn_{1-y}Te$ substrate may be employed with the same effects as described above.

Figure 21:
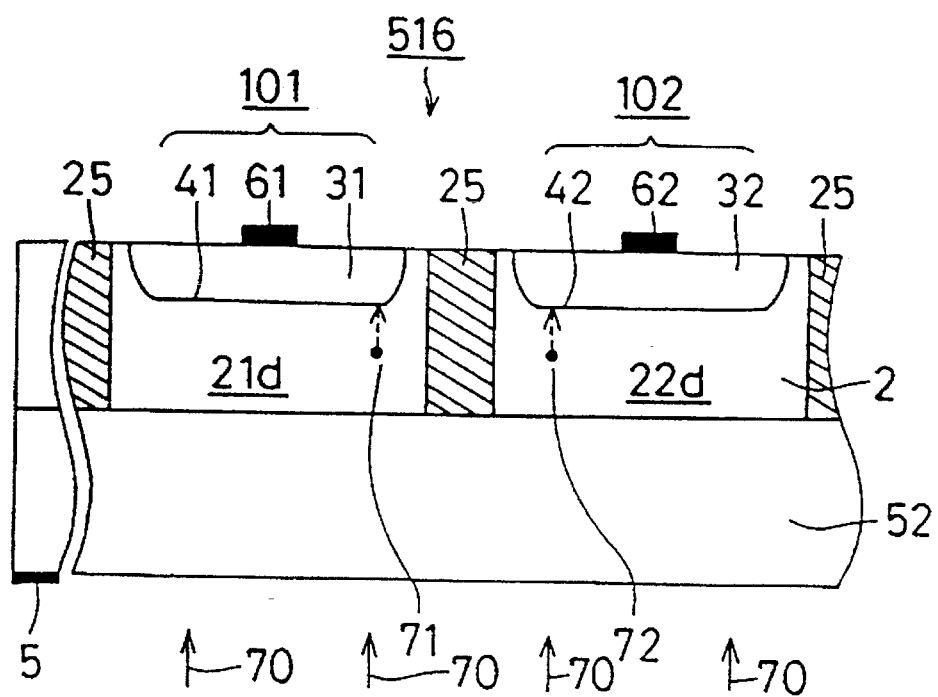
FIG. 21 is a sectional view illustrating an infrared detector in accordance with a sixteenth embodiment of the present invention.

FIG. 21 is a sectional view illustrating an infrared detector in accordance with a sixteenth embodiment of the present invention. In FIG. 21, an infrared detector 516 includes a GaAs substrate 52. A plurality of p type CdHgTe layers 21d and 22d are disposed on the GaAs substrate 52. A lattice-shaped high resistivity AlGaAs layer 25 is disposed on the GaAs substrate 52 where the CdHgTe layers are absent.

Figure 22:
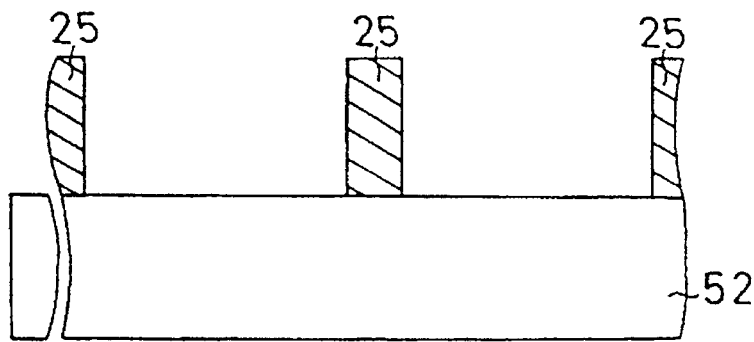
FIGS. 22(a)–22(d) are sectional views illustrating process steps in a method for fabricating the infrared detector of FIG. 21.
Figure 22:
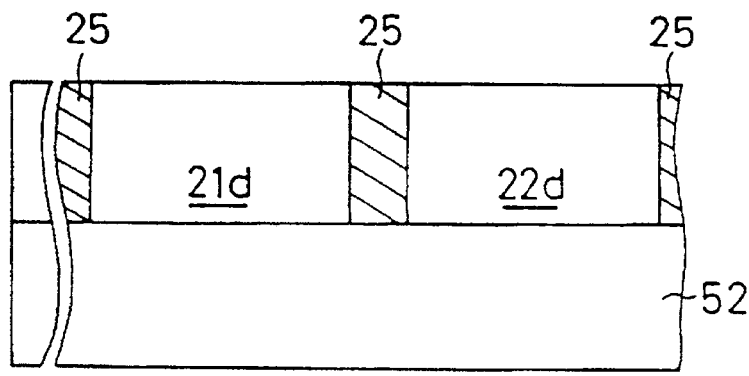
Figure 22:
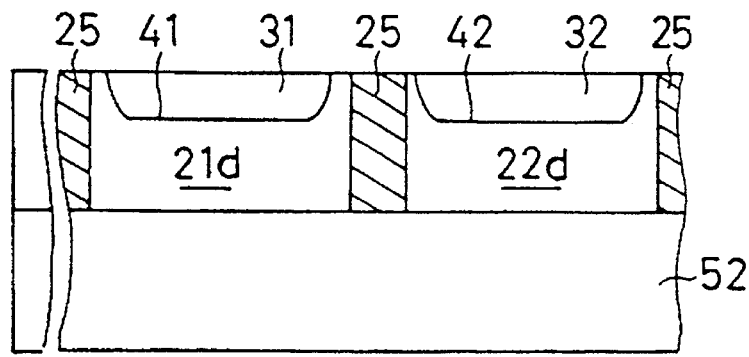
Figure 22:
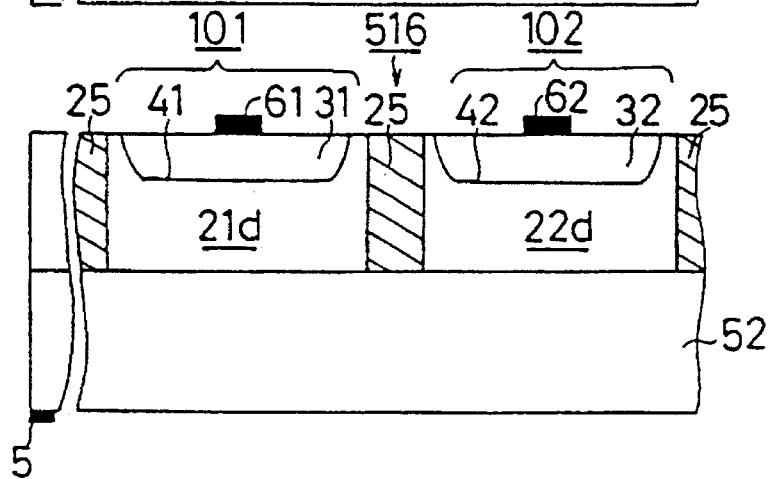

FIGS. 22(a)–22(d) are sectional views illustrating process steps in a method for fabricating the infrared detector of FIG. 21. Initially, as illustrated in FIG. 22(a), the lattice-shaped AlGaAs layer 25 is formed on the GaAs substrate 52. More specifically, a high resistivity AlGaAs layer is grown over the entire surface of the GaAs substrate 52 by LPE, MOCVD, or MBE and, thereafter, it is patterned in a lattice shape by conventional photolithography and etching techniques to selectively expose portions of the GaAs substrate 52.

In the step of FIG. 22(b), buffer layers (not shown) and p type CdHgTe layers 21d and 22d are selectively grown on the exposed portions of the GaAS substrate 52.

In the step of FIG. 22(c), n type regions 31 and 32 are produced at the surface of the p type CdHgTe layers 21d and 22d, respectively, by ion implantation or impurity diffusion.

To complete the structure of FIG. 22(d), negative electrodes 61 and 62 are deposited in contact with the n type regions 31 and 32, respectively, and a positive electrode (not shown) is deposited in contact with the light incident surface of the substrate 52.

In FIG. 21, charge carriers (electrons 71 and 72) generated due to absorption of infrared light 70 reach the pn junction 41 and 42 and are detected as output power of the pixels 101 and 102, respectively. In order to increase the carrier collection efficiency, a bias voltage is applied to the positive electrode 5. In this sixteenth embodiment of the invention, since the high resistivity AlGaAs layer 25 is interposed between the adjacent pixels 101 and 102, carriers are reflected by this layer 25. Therefore, the electron 71 generated in the pixel 101 never reaches the pn junction 42 of the adjacent pixel 102, whereby crosstalk is prevented.

While in the above-described sixteenth embodiment a high resistivity AlGaAs layer is used for isolating a plurality of pixels from each other, other high resistivity III–V compound semiconductor layers, such as a high resistivity AlGaInP layer, may be employed with the same effects as described above.

Figure 23:
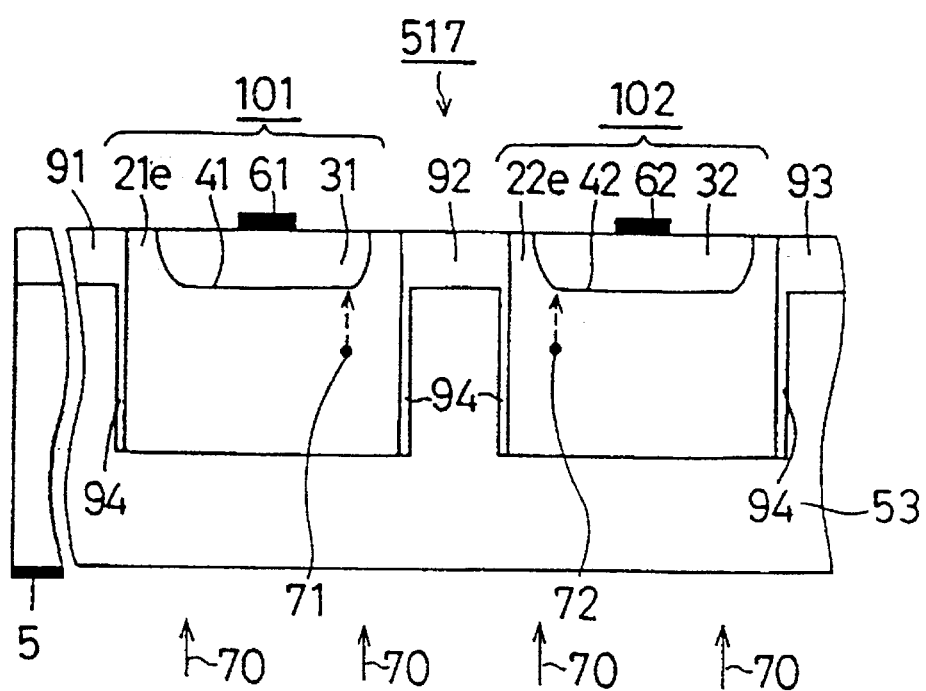
FIG. 23 is a sectional view illustrating an infrared detector in accordance with a seventeenth embodiment of the present invention.

FIG. 23 is a sectional view illustrating an infrared detector in accordance with a seventeenth embodiment of the present invention. In FIG. 23, an infrared detector 517 includes a p type silicon substrate 53. P type CdHgTe layers 21e and 22e are disposed in the Si substrate 53, and silicon oxide films 91, 92, 93, and 94 are disposed in the Si substrate 53 where the p type CdHgTe layers are absent.

Figure 24A:
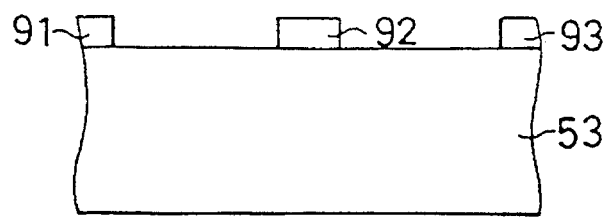
FIGS. 24(a)–24(f) are sectional views illustrating process steps in a method for fabricating the infrared detector of FIG. 23.

FIGS. 24(a)–24(f) are sectional views illustrating process steps in a method for fabricating the infrared detector of FIG. 23. Initially, as illustrated in FIG. 24(a), a silicon oxide film is deposited over the entire surface of the p type Si substrate 53 and patterned in a lattice shape by conventional photolithography and etching techniques to selectively expose portions of the Si substrate 53.

Figure 24B:
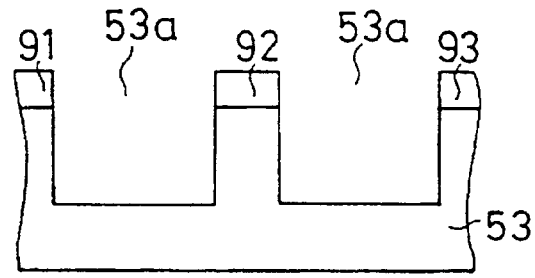

Using the silicon oxide pattern as a mask, the Si substrate 53 is etched by anisotropic etching, such as RIE (Reactive Ion Etching) to produce trenches 53a in the substrate 53 (FIG. 24(b)).

Figure 24C:
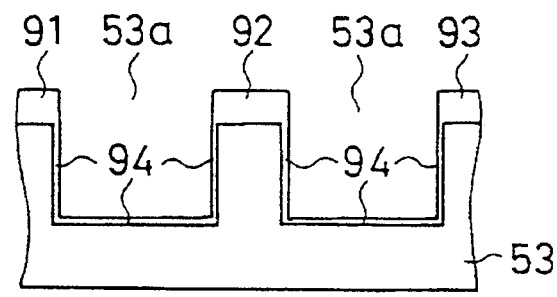

Thereafter, a silicon oxide film 94 is formed on the bottom and side surface of each trench 53a by heat treatment (FIG. 24(c)).

Figure 24D:
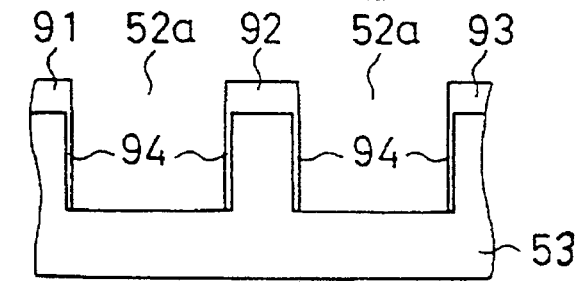

In the step of FIG. 24(d), the silicon oxide film 94 at the bottom of the trench 53a is selectively removed by anisotropic etching, such as RIE, to expose the Si substrate 53. Since the anisotropic etching proceeds in the direction, perpendicular to the surface of substrate, the silicon oxide film on the side surface of the trench 53a is not etched. Since the lattice-shaped silicon oxide film 91 on the substrate 53 is thicker than the silicon oxide film 94 at the bottom of the trench 53a, it is not completely etched away during the etching process although its thickness is reduced.

Figure 24E:
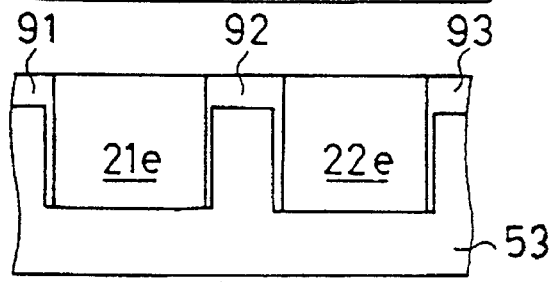
Figure 24F:
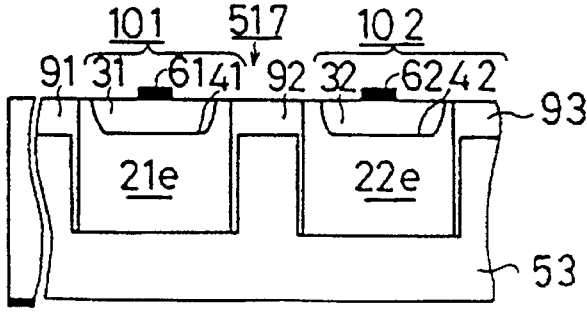

In the step of FIG. 24(e), using the silicon oxide film 91 as a mask for selective growth, a p type CdHgTe layer is grown on the p type silicon substrate exposed in the trenches 53a. As described above, a CdHgTe layer grown on an Si substrate has a relatively high defect density because of the large difference in lattice constants between CdHgTe and Si. Therefore, in this embodiment of the present invention, initially a low-temperature GaAs buffer layer (not shown) and a strained superlattice buffer layer (not shown) are grown on the Si substrate 53 and, thereafter, a GaAs layer with a low defect density is grown thereon. Then, a CdTe buffer layer (not shown) and an HgTe-CdTe superlattice buffer layer (not shown) are successively grown on the GaAs layer. Finally, a CdTe layer having a low defect density and a CdHgTe layer are successively grown to complete the CdHgTe layers 21e and 22e having a low defect density.

Thereafter, n type regions 31 and 32 are produced in the p type CdHgTe layers 21e and 22e, respectively, by ion implantation or diffusion. Finally, negative electrodes 61 and 62 are produced in contact with these n type regions 31 and 32, respectively, and a positive electrode 5 is produced on the rear surface of the p type Si substrate, completing the structure of FIG. 24(f).

In this seventeenth embodiment of the invention, since a plurality of pixels are isolated from each other by the lattice-shaped silicon oxide film 91, these pixels are electrically isolated, so that electrons generated in one pixel do not diffuse into an adjacent pixel, preventing crosstalk.

What is claimed is:

1. An infrared detector comprising:

a semiconductor substrate of a first conductivity type and having opposite front and rear surfaces;

a first CdHgTe layer of the first conductivity type having a first Cd concentration and disposed on the front surface of the semiconductor substrate;

a second CdHgTe layer of the first conductivity type having a second Cd concentration lower than the first concentration of Cd and disposed on the first CdHgTe layer;

a plurality of spaced apart first CdHgTe regions of a second conductivity type, opposite the first conductivity type, disposed in the second CdHgTe layer and having a third Cd concentration;

at least one second CdHgTe region of the first conductivity type extending transverse to the substrate through the second CdHgTe layer to the first CdHgTe layer, separating respective first CdHgTe regions from each other, and having a fourth Cd concentration larger than the second Cd concentration; and a third CdHgTe layer disposed on and covering the second CdHgTe layer and the first and second CdHgTe regions, having a fifth Cd concentration larger than the second Cd concentration, having the second conductivity type opposite the first CdHgTe regions, and the first conductivity type elsewhere.

2. The infrared detector of claim 1 wherein the first, fourth, and fifth Cd concentrations are approximately the same and the second and third Cd concentrations are approximately the same.

3. The infrared detector of claim 1 wherein the second CdHgTe region is lattice-shaped.

4. The infrared detector of claim 1 including at least one electrode disposed on the semiconductor substrate.

5. The infrared detector of claim 1 including a respective electrode disposed opposite each of the first CdHgTe regions.

6. The infrared detector of claim 1 including a lattice-shaped electrode disposed on the second CdHgTe region, each of the first CdHgTe regions being surrounded by respective parts of the electrode.

7. The infrared detector of claim 6 wherein the lattice-shaped electrode is disposed at least partially within the second CdHgTe region.

* * * * *